United States Patent
Saito et al.

(10) Patent No.: US 10,955,505 B2
(45) Date of Patent: Mar. 23, 2021

(54) MAGNETIC RESONANCE IMAGING APPARATUS, IMAGE PROCESSING APPARATUS, AND MAGNETIC RESONANCE IMAGING METHOD

(71) Applicant: Toshiba Medical Systems Corporation, Otawara (JP)

(72) Inventors: Kanako Saito, Kawasaki (JP); Hidenori Takeshima, Minato (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 485 days.

(21) Appl. No.: 15/351,886

(22) Filed: Nov. 15, 2016

(65) Prior Publication Data
US 2017/0139028 A1    May 18, 2017

(30) Foreign Application Priority Data

Nov. 17, 2015   (JP) .............................. JP2015-225187

(51) Int. Cl.
| | |
|---|---|
| *G01R 33/561* | (2006.01) |
| *G01R 33/563* | (2006.01) |
| *G01R 33/56* | (2006.01) |
| *G01R 33/48* | (2006.01) |

(52) U.S. Cl.
CPC ...... *G01R 33/5611* (2013.01); *G01R 33/4818* (2013.01); *G01R 33/5608* (2013.01); *G01R 33/5635* (2013.01); *G01R 33/56308* (2013.01)

(58) Field of Classification Search
CPC .................. G01R 33/44; G01R 33/48–586
See application file for complete search history.

(56) References Cited

U.S. PATENT DOCUMENTS

| | | | |
|---|---|---|---|
| 7,925,087 B2* | 4/2011 | Slabaugh | G06K 9/6207 382/164 |
| 2007/0182412 A1* | 8/2007 | Katscher | G01R 33/4824 324/309 |
| 2007/0217713 A1* | 9/2007 | Milanfar | G06T 3/4053 382/299 |

(Continued)

FOREIGN PATENT DOCUMENTS

JP           2014-500041           1/2014

OTHER PUBLICATIONS

Klaas P. Pruessmann, et al. "SENSE: Sensitivity Encoding for Fast MRI", Magnetic Resonance in Medicine, 42:952-962, 1999, 11 pages.

*Primary Examiner* — Huy Q Phan
*Assistant Examiner* — David B Frederiksen
(74) *Attorney, Agent, or Firm* — Oblon, McClelland, Maier & Neustadt, L.L.P.

(57) ABSTRACT

A magnetic resonance imaging apparatus according to an embodiment includes sequence controlling circuitry and processing circuitry. The sequence controlling circuitry is configured to acquire k-space data by executing a pulse sequence while performing undersampling. The processing circuitry is configured to generate an output target image by generating a folded image by applying a Fourier transform to the k-space data and further unfolding the folded image by performing a process that uses a regularization term. The processing circuitry applies a weight to the regularization term on the basis of whether or not each of the pixels in the output target image is included in an observation target region.

18 Claims, 13 Drawing Sheets

(56) References Cited

U.S. PATENT DOCUMENTS

| | | | | |
|---|---|---|---|---|
| 2008/0197842 | A1* | 8/2008 | Lustig | G01R 33/5635 324/307 |
| 2008/0292163 | A1* | 11/2008 | DiBella | G01R 33/561 382/131 |
| 2009/0123048 | A1* | 5/2009 | Leroux | G06T 11/006 382/131 |
| 2009/0285463 | A1* | 11/2009 | Otazo | G06T 3/4053 382/131 |
| 2011/0044524 | A1* | 2/2011 | Wang | G01R 33/54 382/131 |
| 2013/0063143 | A1* | 3/2013 | Adalsteinsson | G01R 33/5612 324/307 |
| 2013/0181711 | A1 | 7/2013 | Chaari et al. | |
| 2014/0219533 | A1* | 8/2014 | Sato | G06T 11/008 382/131 |
| 2014/0285194 | A1 | 9/2014 | Hutter et al. | |
| 2014/0355901 | A1* | 12/2014 | Tezaur | G06T 5/003 382/255 |
| 2015/0061671 | A1* | 3/2015 | Greiser | A61B 5/0263 324/309 |
| 2015/0084628 | A1* | 3/2015 | Sato | G01R 33/243 324/309 |
| 2015/0192654 | A1* | 7/2015 | Zhu | G01R 33/5611 324/309 |
| 2015/0285877 | A1* | 10/2015 | Pfeuffer | G01R 33/34092 324/309 |
| 2015/0309300 | A1* | 10/2015 | Higaki | G02B 21/14 348/79 |
| 2015/0310639 | A1* | 10/2015 | Bilgic | G01R 33/243 382/131 |
| 2015/0346305 | A1* | 12/2015 | King | G01R 33/5611 324/309 |
| 2015/0355303 | A1* | 12/2015 | Kuhara | G01R 33/5611 324/322 |
| 2016/0247299 | A1* | 8/2016 | Tan | G06T 11/003 |

* cited by examiner

FIG.3

| 21 | | | | |
|---|---|---|---|---|
| | 1 | 5 | 1 | 1 |
| | 5 | 5 | 5 | 5 |
| | 1 | 5 | 1 | 1 |
| | 1 | 5 | 1 | 1 |

REGULARIZATION TERM=44

| 22 | | | | |
|---|---|---|---|---|
| | 3 | 3 | 2 | 2 |
| | 3 | 3 | 3 | 2 |
| | 3 | 3 | 3 | 3 |
| | 3 | 3 | 2 | 2 |

REGULARIZATION TERM=44

| 23 | | | | |
|---|---|---|---|---|
| | 5 | 5 | 5 | 5 |
| | 1 | 1 | 1 | 5 |
| | 1 | 1 | 1 | 5 |
| | 1 | 1 | 1 | 5 |

REGULARIZATION TERM=44

WITHOUT REGION ESTIMATION

| 24 | | | | |
|---|---|---|---|---|
| | 1 | 0 | 1 | 1 |
| | 0 | 0 | 0 | 0 |
| | 1 | 0 | 1 | 1 |
| | 1 | 0 | 1 | 1 |

REGULARIZATION TERM=9

| 25 | | | | |
|---|---|---|---|---|
| | 3 | 0 | 2 | 2 |
| | 3 | 0 | 3 | 2 |
| | 0 | 0 | 0 | 0 |
| | 3 | 0 | 3 | 2 |

REGULARIZATION TERM=23

| 26 | | | | |
|---|---|---|---|---|
| | 5 | 0 | 5 | 5 |
| | 1 | 0 | 1 | 5 |
| | 0 | 0 | 0 | 0 |
| | 1 | 0 | 1 | 5 |

REGULARIZATION TERM=29

WITH REGION ESTIMATION

FIG.10

| | PIXEL 1 | PIXEL 2 | PIXEL 3 | AVERAGE VALUE | STANDARD DEVIATION | TOLERANCE STANDARD DEVIATION |
|---|---|---|---|---|---|---|
| CHANNEL 1 | 23 | 8 | 32 | $\mu_1=20$ | $\sigma_1=5$ | $2\sigma$ |
| CHANNEL 2 | 18 | 0 | 25 | $\mu_2=20$ | $\sigma_2=5$ | $2\sigma$ |
| CHANNEL 3 | 1 | 20 | 10 | $\mu_3=10$ | $\sigma_3=4$ | $2\sigma$ |

↓ JUDGMENT

| | PIXEL 1 | PIXEL 2 | PIXEL 3 |
|---|---|---|---|
| CHANNEL 1 | $W_1=0$ | $W_1=1$ | $W_1=1$ |
| CHANNEL 2 | $W_2=0$ | $W_2=1$ | $W_2=1$ |
| CHANNEL 3 | $W_3=1$ | $W_3=1$ | $W_3=0$ |

↓ OVERALL JUDGMENT

| PIXEL 1 | PIXEL 2 | PIXEL 3 |
|---|---|---|
| W=1/3 | W=1 | W=2/3 |

FIG.11

| | PIXEL 1 | PIXEL 2 | PIXEL 3 | AVERAGE VALUE | STANDARD DEVIATION |
|---|---|---|---|---|---|
| CHANNEL 1 | 23 | 8 | 32 | $\mu_1=20$ | $\sigma_1=5$ |
| CHANNEL 2 | 18 | 0 | 25 | $\mu_2=20$ | $\sigma_2=5$ |
| CHANNEL 3 | 1 | 20 | 10 | $\mu_3=10$ | $\sigma_3=4$ |

↓ JUDGMENT

| | PIXEL 1 | PIXEL 2 | PIXEL 3 |
|---|---|---|---|
| CHANNEL 1 | $+0.6\sigma_1$ | $-2.4\sigma_1$ | $+2.4\sigma_1$ |
| CHANNEL 2 | $-0.4\sigma_2$ | $-4.0\sigma_2$ | $+1.0\sigma_2$ |
| CHANNEL 3 | $-2.25\sigma_3$ | $+2.5\sigma_3$ | 0 |

↓ CALCULATE LOCAL WEIGHTING COEFFICIENT Wi

| | PIXEL 1 | PIXEL 2 | PIXEL 3 |
|---|---|---|---|
| CHANNEL 1 | $W_1=0.451$ | $W_1=0.909$ | $W_1=0.909$ |
| CHANNEL 2 | $W_2=0.329$ | $W_2=0.982$ | $W_2=0.632$ |
| CHANNEL 3 | $W_3=0.895$ | $W_3=0.918$ | $W_3=0$ |

↓ OVERALL JUDGMENT

| | PIXEL 1 | PIXEL 2 | PIXEL 3 |
|---|---|---|---|
| MEAN SQUARE METHOD | $W=0.609$ | $W=0.937$ | $W=0.639$ |
| MAXIMUM VALUE METHOD | $W=0.895$ | $W=0.982$ | $W=0.909$ |

MAGNETIC RESONANCE IMAGING APPARATUS, IMAGE PROCESSING APPARATUS, AND MAGNETIC RESONANCE IMAGING METHOD

CROSS-REFERENCE TO RELATED APPLICATIONS

This application is based upon and claims the benefit of priority from Japanese Patent Application No. 2015-225187, filed on Nov. 17, 2015; the entire contents of which are incorporated herein by reference.

FIELD

Embodiments described herein relate generally to a magnetic resonance imaging apparatus, an image processing apparatus, and a magnetic resonance imaging method.

BACKGROUND

During magnetic resonance imaging processes using a Parallel Imaging (PI) method, for example, k-space data is acquired by using a plurality of coils, and subsequently, a medical image (an output target image) is generated by performing an image reconstructing process. This image reconstructing process is an example of an inverse problem, which is to restore the output target image from the acquired k-space data. As for the image reconstructing process represented by the inverse problem, the solution to an optimization problem may sensitively be dependent on small changes in input data. As a result, for example, when the inverse problem s solved by using a least-squares method, the solution may not uniquely be determined and may diverge.

In that situation, for the purpose of improving the robustness of the solution, a regularization process is often performed, which is an operation to introduce a predetermined additional term into an objective function as a penalty term.

However, when the regularization process is performed on the image to be output (the output target image) by simply using a predetermined norm, the quality of the output target image resulting from the reconstructing process may be degraded, contrary to the expectation.

BRIEF DESCRIPTION OF THE DRAWINGS

FIGS. 2 and 3 are drawings for explaining an overview of an image generating process performed by the magnetic resonance imaging apparatus according to the first embodiment;

FIGS. 8 to 12 are drawings for explaining a process of calculating local weighting coefficients performed by the magnetic resonance imaging apparatus according to the first embodiment;

DETAILED DESCRIPTION

Figure 1:
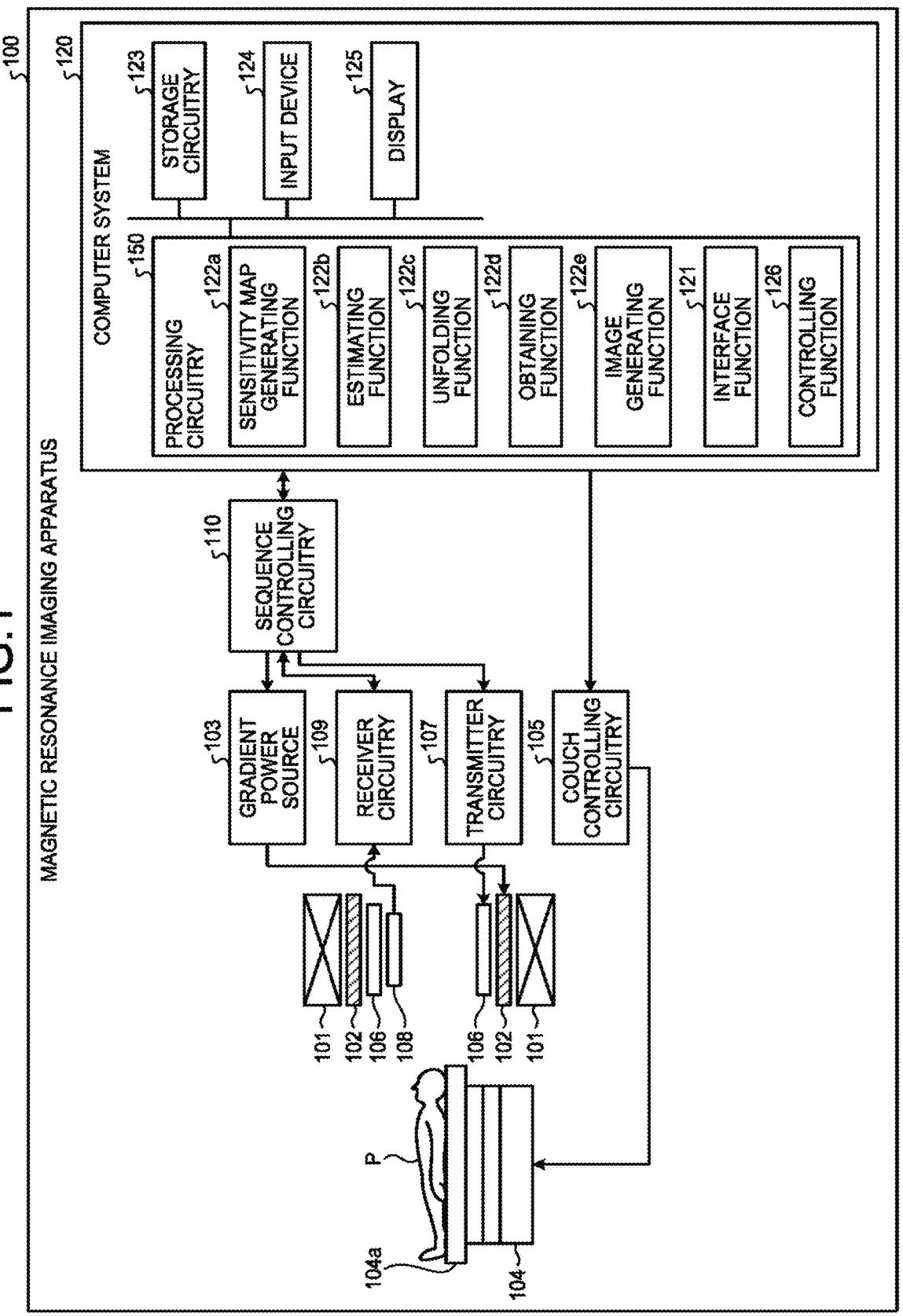
FIG. 1 is a block diagram illustrating a magnetic resonance imaging apparatus according to a first embodiment.

A magnetic resonance imaging apparatus according to an embodiment includes sequence controlling circuitry and processing circuitry. The sequence controlling circuitry is configured to acquire k-space data by executing a pulse sequence while performing undersampling. The processing circuitry is configured to generate an output target image by generating a folded image by applying a Fourier transform to the k-space data and further unfolding the folded image by performing a process that uses a regularization term. The processing circuitry applies a weight to the regularization term on the basis of whether or not each of the pixels in the output target image is included in an observation target region.

Exemplary embodiments of the present disclosure will be explained, with reference to the accompanying drawings. Some of the configurations that are the same as each other will be referred to by using the same reference characters, and duplicate explanations thereof will be omitted.

First Embodiment

FIG. 1 is a block diagram illustrating a magnetic resonance imaging apparatus according to a first embodiment. As illustrated in FIG. 1, a magnetic resonance imaging apparatus 100 includes a static magnetic field magnet 101, a gradient coil 102, a gradient power source 103, a couch 104, couch controlling circuitry 105, a transmitter coil 106, transmitter circuitry 107, a receiver coil 108, receiver circuitry 109, sequence controlling circuitry 110, and a computer system 120. The magnetic resonance imaging apparatus 100 does not include an examined subject (hereinafter, "subject") P (e.g., a human body).

The static magnetic field magnet 101 is a magnet formed to have a hollow and substantially circular cylindrical shape and is configured to generate a uniform static magnetic field in a space formed on the inside thereof. For example, the static magnetic field magnet 101 may be realized with a permanent magnet, a superconductive magnet, or the like. The gradient coil 102 is a coil formed to have a hollow and substantially circular cylindrical shape and is disposed on the inside of the static magnetic field magnet 101. The gradient coil 102 is formed by combining together three coils corresponding to X-, Y-, and axes that are orthogonal to one another. By individually receiving an electric current from the gradient power source 103, the three coils generate gradient magnetic fields of which the magnetic field intensities change along the X-, Y-, and Z-axes. The Z-axis direction is assumed to be the same direction as that of the static magnetic field.

The gradient power source 103 is configured to supply the electric current to the gradient coil 102. In this situation, the gradient magnetic fields generated by the gradient coil 102 along the X-, Y-, and Z-axes correspond to, for example, a slice-selecting gradient magnetic field Gs, a phase-encoding gradient magnetic field Ge, and a read-out gradient magnetic field Gr, respectively. The slice-selecting gradient magnetic field Gs is used for the purpose of arbitrarily determining an image taking cross-section. The phase-encoding gradient magnetic field Ge is used for the purpose of varying the phase of a magnetic resonance signal in accordance with a spatial position. The read-out gradient magnetic field Gr is used for the purpose of varying the frequency of a magnetic resonance signal in accordance with a spatial position.

The couch 104 includes a couchtop 104a on which the subject P is placed. Under control of the couch controlling circuitry 105, the couchtop 104a is inserted into the hollow (an image taking opening) of the gradient coil 102, while the subject P is placed thereon. Usually, the couch 104 is installed in such a manner that the longitudinal direction thereof extends parallel to the central axis of the static magnetic field magnet 101. The couch controlling circuitry 105 is configured to move the couchtop 104a in the longitudinal directions and the up-and-down directions by driving the couch 104, under control of the computer system 120.

The transmitter coil 106 is disposed on the inside of the gradient coil 102 and is configured to generate a radio-frequency magnetic field by receiving a supply of a Radio Frequency (RF) pulse from the transmitter circuitry 107. The transmitter circuitry 107 is configured to supply the RF pulse corresponding to a Larmor frequency determined by the type of a targeted atomic nucleus and the intensity of the magnetic field, to the transmitter coil 106.

The receiver coil 108 is disposed on the inside of the gradient coil 102 and is configured to receive magnetic resonance signals emitted from the subject P due to an influence of the radio-frequency magnetic field. When having received the magnetic resonance signals, the receiver coil 108 outputs the received magnetic resonance signals to the receiver circuitry 109. In the first embodiment, the receiver coil 108 is a coil array including one or more (typically, two or more) receiver coils.

The receiver circuitry 109 is configured to generate magnetic resonance data on the basis of the magnetic resonance signals output from the receiver coil 108. More specifically, the receiver circuitry 109 generates the magnetic resonance data by applying a digital conversion to the magnetic resonance signals output from the receiver coil 108. Further, the receiver circuitry 109 transmits the generated magnetic resonance data to the sequence controlling circuitry 110. The receiver circuitry 109 may be provided on the gantry device side where the static magnetic field magnet 101, the gradient coil 102, and the like are provided. In the first embodiment, the magnetic resonance signals output from coil elements of the receiver coil 108 are output to the receiver circuitry 109 in units called "channels" or the like, by being distributed or combined as appropriate. Thus, the magnetic resonance data is treated in correspondence with the channels in the processes performed by the receiver circuitry 109 and the stages subsequent thereto. The total quantity of the coil elements may be equal to the total quantity of the channels. Alternatively, the total quantity of the channels may be smaller than the total quantity of the coil elements. Conversely, the total quantity of the channels may be larger than the total quantity of the coil elements. In the following sections, when expressions such as "in correspondence with (corresponding to) the channels", "for each of the channels", and the like are used, it means that the process may be performed in correspondence with the coil elements or may be performed in correspondence with the channels resulting from distributing or combining the coil elements. The timing of the distributing and/or the combining is not limited to the timing described above. It is sufficient when the magnetic resonance signals or the magnetic resonance data is distributed or combined into units of channels any time before the process employing an image generating function 122e of processing circuitry 150 (explained later) is performed.

The sequence controlling circuitry 110 is configured to perform an image taking process on the subject P, by driving the gradient power source 103, the transmitter circuitry 107, and the receiver circuitry 109, on the basis of sequence information transmitted thereto from the computer system 120. In this situation, the sequence information is information defining a procedure to perform the image taking process. The sequence information defines: the intensity of electric power to be supplied from the gradient power source 103 to the gradient oil 102 and the timing with which the electric power is to be supplied; the intensity of the Radio Frequency (RF) pulse to be transmitted from the transmitter circuitry 107 to the transmitter coil 106 and the timing with which the RF pulse is to be applied; the timing with which the magnetic resonance signals are to be detected by the receiver circuitry 109; and the like.

When having received the magnetic resonance data from the receiver circuitry 109 as a result of the image taking process performed on the subject P by driving the gradient power source 103, the transmitter circuitry 107, and the receiver circuitry 109, the sequence controlling circuitry 110 transfers the received magnetic resonance data to the computer system 120.

The computer system 120 is configured to exercise overall control of the magnetic resonance imaging apparatus 100 and to perform a data acquiring process, an image generating process, and the like. The computer system 120 includes the processing circuitry 150, storage circuitry 12 an input device 124, and a display 125. The processing circuitry 150 includes an interface function 121, a sensitivity map generating function 122a, an estimating function 122b, an unfolding function 122c, an obtaining function 122d, the image generating function 122e, and a controlling function 126. Specific processes performed by the estimating function 122b and the unfolding function 122c and details of the image generating function 122e will be explained later.

In the first embodiment, processing functions implemented by the interface function 121, the sensitivity map generating function 122a, the estimating function 122b, the unfolding function 122c, the obtaining function 122d, the image generating function 122e, and the controlling function 126 are stored in the storage circuitry 123 in the form of computer-executable programs. The processing circuitry 150 is a processor configured to realize the functions corresponding to the programs, by reading and executing the programs from the storage circuitry 123. In other words, it means that the processing circuitry 150 that has read the programs has the functions illustrated on the inside of the processing circuitry 150 in FIG. 1. Although the single processing circuitry 150 is described, with reference to FIG. 1, as realizing the processing functions implemented by the interface function 121, the sensitivity map generating function 22a, the estimating function 122b, the unfolding function 122c, the obtaining function 122d, the image generating function 122e, and the controlling function 126, another arrangement is also acceptable in which the processing circuitry 150 is structured by combining a plurality of independent processors together, so that the processors realize the functions by executing the programs.

In other words, each of the abovementioned functions may be structured as a program so that the single processing circuitry executes the programs, or alternatively, specific functions may be installed in independent and dedicated program-executing circuits. In the present example, the sequence controlling circuitry 110 and the estimating function 122b and the image generating function 122 included in the processing circuitry 150 are examples of a sequence controlling unit, an estimating unit, and a generating unit, respectively.

The term "processor" used in the explanation above denotes, for example, a circuit such as a Central Processing Unit (CPU), a Graphical Processing Unit (GPU), an Application Specific Integrated Circuit (ASIC), or a Programmable Logic Device (e.g., a Simple Programmable Logic Device [SPLD], a Complex Programmable Logic Device [CPLD], or a Field Programmable Gate Array [FPGA]). One or more of the processors realize the functions by reading and executing the programs stored in the storage circuitry 123.

Alternatively, it is also acceptable to directly incorporate the programs into the circuitry of the one or more processors, instead of having the programs stored in the storage circuitry 123. In that situation, the one or more processors realize the functions by reading and executing the programs incorporated in the circuit thereof. Further, the couch controlling circuitry 105, the transmitter circuitry 107, the receiver circuitry 109, and the like may also be structured with electronic circuits such as the processors described above.

By employing the interface function 121, the processing circuitry 150 is configured to transmit the sequence information to the sequence controlling circuitry 110 and to receive the magnetic resonance data from the sequence controlling circuitry 110. Further, when having received the magnetic resonance data, the processing circuitry 150 including the interface function 121 stores the received magnetic resonance data into the storage circuitry 123. The storage circuitry 123 is configured to store therein time-series k-space data corresponding to either a single channel or two or more channels.

The processing circuitry 150 including the image generating function 122e is configured to generate an image by using data obtained by the obtaining function 122d and/or data stored in the storage circuitry 123. To the processing circuitry 150 including the image generating function 132e, two types of time-series k-space data obtained by implementing mutually-different obtaining methods are input. The two types of time-series k-space data represent a blood vessel rendering sequence and may represent, for example, an image (a tag image) in which the blood in a specific region is excited and labeled, such as images acquired by implementing an Arterial Spin Labeling-Magnetic Resonance Angiography (ASL-MRA) method and another image (a control image) in which the blood is not excited and labeled. In the description of the embodiments below, the example will be explained in which the two types of time-series k-space data represent the tag image and the control image acquired by implementing the ASL-MRA method; however, the embodiments of the present disclosure are not limited to this example. For instance, the present disclosure is similarly applicable to other methods such as contrast enhanced Magnetic Resonance Angiography (MRA) methods, Flow-Spoiled Fresh Blood Imaging (FBI) methods, Phase Contrast methods, and the like. When such magnetic resonance imaging sequences are used, a desired image is rendered by calculating the difference between the two images. The processing circuitry 152 including the image generating function 122e generates a predetermined image by employing the sensitivity map generating function 122a, the estimating function 122b, and the unfolding function 122c. The image obtained by the processing circuitry 150 by employing the image generating function 122e may be displayed on the display 125 or may be forwarded to and stored in the storage circuitry 123, as necessary.

By employing the sensitivity map generating function 122a, the processing circuitry 150 is configured to generate a sensitivity map providing sensitivity distribution information of the coils, from acquired data corresponding to the channels obtained by the obtaining function 122d by performing a preparatory scan or a main scan. By employing the estimating function 122b, the processing circuitry 150 is configured to estimate the likelihood of being a blood vessel region for each of the pixels in an x-space, on the basis of the time-series k-space data corresponding to the channels obtained by the obtaining function 122d. As the sensitivity map, the processing circuitry 150 including the sensitivity map generating function 122a may generate two types of sensitivity maps for a tag-image reconstructing-purpose and a control-image reconstructing-purpose or may generate one type of sensitivity map to be used in common.

In the embodiments described below, the "x-space" denotes a hydrogen distribution image space. (For the sake of convenience, images will be referred to as hydrogen distribution images in the embodiments of the present disclosure, including the situation where the target of an image taking process is other than hydrogen atoms). The term "x-space data" denotes a set of signal points in the x-space. Mutually-different signal points in the x-space are kept in correspondence with signal points in mutually-different positions in the x-space. For example, three-dimensional hydrogen distribution image of the brain is represented by three-dimensional x-space data. A two-dimensional x-space image obtained by imaging a cross-section of the heart is represented by two-dimensional x-space data.

Further, by employing the obtaining function 122d, the processing circuitry 150 is configured to obtain k-space data in a single phase or in a time series corresponding to a plurality of channels, while varying the sampling position in the spatial direction. Further, by employing the obtaining function 122d, for example, the processing circuitry 150 is configured to obtain data by using two types of sequences such as a tag-image acquiring sequence and a control-image acquiring sequence.

The processing circuitry 150 is configured to exercise overall control of the magnetic resonance imaging apparatus 100 by employing the controlling function 126. More specifically, the processing circuitry 150 including the controlling function 126 controls the image taking process by generating the sequence information on the basis of an image taking condition input by an operator via the input device 124 and further transmitting the generated sequence information to the sequence controlling circuitry 110. Further, by employing the controlling function 126, the processing circuitry 150 is configured to control an image reconstructing process performed by using the magnetic resonance data sent thereto from the sequence controlling circuitry 110 as a result of the image taking process and is configured to control a display process performed by the display 125. For example, the controlling function 126 may be installed as an integrated circuit such as an Application Specific Integrated Circuit (ASIC) or a Field Programmable Gate Array (FPGA) or an electronic circuit such as a Central Processing Unit (CPU) or a Micro Processing Unit (MPU).

The storage circuitry 123 is configured to store therein the magnetic resonance data received by the processing circuitry 150 including the interface function 121, the image data generated by the processing circuitry 150 by employing the image generating function 122e, and the like. For example, the storage circuitry 123 is configured by using a semiconductor memory element such as a Random Access Memory (RAM) or a flash memory, a hard disk, an optical disk, or the like.

The input device 124 is configured to receive various types of instructions and inputs of information from the operator. For example, the input device 124 may be a pointing device such as a mouse or a trackball or may be an inputting device such as a keyboard. Under the control of the controlling function 126 included in the processing circuitry 150, the display 125 is configured to display various types of information such as the image data or the like. For example, the display 125 is configured by using a display device such as a liquid crystal display device.

First, as a background related to the magnetic resonance imaging apparatus according to an embodiment, an image reconstructing process and a regularization process during a parallel imaging process will briefly be explained.

The magnetic resonance imaging apparatus 100 is an apparatus used for rendering information about the inside of the subject in an image, by utilizing a nuclear magnetic resonance phenomenon. The magnetic resonance imaging apparatus is configured to obtain a magnetic resonance image by acquiring data called k-space data by sampling nuclear magnetic resonance signals emitted from specific nuclei (e.g., the nuclei of hydrogen atoms) positioned on the inside of the subject by using the coils and further applying a Fourier transform to the k-space data.

The nuclear magnetic resonance signals are sampled as one-dimensional data. Thus, to obtain a two- or three-dimensional magnetic resonance image, the magnetic resonance imaging apparatus 100 repeatedly performs a one-dimensional sampling process in the k-space so as to acquire the data necessary for generating the magnetic resonance image. When the k-space data has been sampled (called "full sampling") at a resolution level equal to that of the magnetic resonance image to be output, it is possible to generate the magnetic resonance image by applying the Fourier transform to the obtained k-space data.

It is known that the sampling process for the magnetic resonance imaging process takes time. In particular, during an image taking process to acquire time-series data, because the sampling process requires time, it is desirable to shorten the sampling time period, also for the purpose of reducing the burden on the patient. Thus, various techniques for realizing a high-speed image taking process have been studied and developed. One example of such techniques is called a Parallel Imaging (PI) method. According to the parallel imaging method, k-space data is acquired by using a plurality of coils, while using a sampling pattern that is thinned out ("undersampled") compared to a sampling pattern used in a full sampling process. If a Fourier transform was applied to the undersampled k-space data without any modification, a phenomenon called aliasing (aliasing of the image) would occur. However, according to the parallel imaging method, it is possible to generate a magnetic resonance imaging image free of aliasing caused by the undersampling, by making use of the difference in the sensitivity levels caused by physical positional arrangements of the coils.

Examples of methods that are often used to realize a parallel imaging process include a Sensitivity Encoding (SENSE) method. Parallel imaging methods can roughly be divided into SENSE-based methods such as the SENSE method, an mSENSE method, and a k-t SENSE method and Simultaneous Acquisition of Spatial Harmonics (SMASH)-based methods such as a GeneRalized Autocalibratirig Partially Parallel Acquisition (GRAPPA) method. According to the former group of methods, a reference scan is performed by using an array coil, and subsequently, a Fourier transform is applied to an image resulting from a main scan acquired by thinning out the data in the k-space, and the image with aliasing is unfolded by using a coil sensitivity map obtained by performing a preparatory scan or the like. According to the latter group of methods, the data in the k-space is acquired while being undersampled, so that sample values that have not yet been acquired in the k-space are generated by using the acquired k-space data before a Fourier transform is performed, and subsequently, an image free of aliasing is obtained by performing the Fourier transform. In the first embodiment, an example using the SENSE method as a reconstructing method will be explained below; however, possible embodiments are not limited to this example. It is acceptable to use any other reconstructing method, e.g., another SENSE-based method, as the reconstructing method.

A procedure using the SENSE method can be explained as follows: At first, the sequence controlling circuitry 110 acquires the sensitivity distribution information of each of the coils by performing a preparatory scan or the like. The processing circuitry 150 obtains the sensitivity distribution information of each of the oils via the sequence controlling circuitry 110, by employing the obtaining function 122d. After that, the processing circuitry 150 generates a sensitivity map of each of the coils, by employing the sensitivity map generating function 122a.

Subsequently, by employing the image generating function 122e, the processing circuitry 150 obtains a magnetic resonance image corresponding to each of the coils by performing a Fourier transform while using undersampled k-space data of each of the coils obtained by performing a main scan (an imaging scan).

Subsequently, by employing the unfolding function 122c, the processing circuitry 150 estimates a true magnetic resonance image (an output target image) on the basis of a relational expression "the magnetic resonance image corresponding to each of the coils is an image obtained by performing a product-sum operation with the sensitivity distribution information of the coil and a signal of the coils having aliasing, on the true magnetic resonance image".

According to the SENSE method, the processing circuitry 150 reconstructs a magnetic resonance image x (the output target image) free of aliasing, by minimizing an energy function (an objective function) E(x) presented in Expression (1) below, by employing the unfolding function 122c.

$$E(x) = \Sigma_{c=1} \|y_c - A_c x\|_2 \tag{1}$$

In Expression (1), the letter "c" denotes a coil number, while "$y_c$" denotes the signal value of a magnetic resonance image corresponding to a c-th coil and having aliasing. Further, the operator $A_c$ is an operator that can be expressed as $A_c = \Gamma \cdot FT \cdot S_c$ where $S_c$ denotes the sensitivity level of the c-th coil, FT denotes a Fourier Transform operation, and $\Gamma$ denotes a sampling operation.

In this situation, as observed from Expression (1), the energy function E(x) is a sum of the $L_2$ norms of $y_c - A_c x$ of the coils. Generally speaking, because norms cannot be negative values, the energy function E(x) is equal to the minimum value 0, when $y_c - A_c x = 0$ is true with all of the coil numbers c. When an inverse operator of $A_c$ is uniquely determined, by solving the equation $y_c - A_c x = 0$ for $x = A_c^{-1} y_c$ is obtained. Accordingly, in certain situations, the processing circuitry 150 is able to generate the output target image x by applying the operator $A_c^{-1}$ to the magnetic resonance image data $y_c$ having aliasing, by employing the unfolding function 122c. For example, many of the situations where the total quantity n of the coils is equal to a reduction factor R correspond to the "certain situations". In the present example, the reduction factor is a value indicating the thinning-out rate of the sampling data with respect to the full sampling data. For example, when the data size of the sampling data is half the data size of the full sampling data, the reduction factor is 2.

However, when the reduction factor R is not equal to the total quantity of coils n, the above is not true in general.

For example, when R>n is satisfied, there are, generally speaking, two or more solutions x that make the energy function E(x) in Expression (1) equal to 0. It is therefore not possible to uniquely determine the output target image x only from the optimization condition of Expression (1).

Conversely, when R<n is satisfied, generally speaking, there is no solution x that satisfies $y_c - A_c x = 0$ for each of all the coil numbers c, in many situations. Accordingly, in those situations, the value of the energy function E(x) in Expression (1) is calculated with respect to each of all the candidates for the output target image x, so that the solution that minimizes the energy function E(x) is determined as the output target image x. For example, when the output target image x has 256 pixels, the energy function E(x) is calculated by varying the value of each of the 256 variables corresponding to the pixels, so as to seek for the output target image x that minimizes the calculated values.

However, when the number of pixels in the output target image x is large, checking on each of all the candidates for the output target image x by using the all-possible-candidates method may be difficult in many situations because of the time period required by the calculation. In those situations, the value of the energy function E(x) shall be calculated only with selected candidates by narrowing down the candidates for the output target image x by ng a certain method. In the manner described above, the inverse problem of restoring the output target image from the acquired k-space data is solved.

The image reconstructing process presented as the inverse problem, however, may often be regarded as what is called an "ill-posed problem" in the sense that the solution to the optimization problem is sensitively dependent on small changes in the input data. In those situations, optimizing the energy function E(x) in Expression (1) by using a direct method is not likely to be an effective solution method. For example, when an inverse problem is solved by using a least-squares method, there is a possibility that the solution may not uniquely be determined and may diverge.

In those situations, for the purpose of improving the robustness of the solution, a regularization process is often performed, which is an operation to introduce a predetermined additional term into the objective function as a penalty term. More specifically, for example, for the purpose of improving the robustness of the solution, the processing circuitry 150 introduces a regularization term as presented in Expression (2), by employing the image generating function 122e.

$$E(x) = \sum_{c=1} \|y_c - A_c x\|_2 + \lambda \|x\|_2 \quad (2)$$

In Expression (2), the symbol "λ" denotes a regularization parameter (an undetermined multiplier) used for controlling the strength of the regularization term. In the example in Expression (2), the processing circuitry 150 adds the $L_2$ norm of the output target image to the objective function (i.e., the energy function E(x) in Expression (1)) as a regularization term, by employing the image generating function 122e. The processing circuitry 150 then determines the output target image x so as to minimize the sum of the objective function and the regularization term (i.e., the energy function E(x) in Expression (2)), by employing the image generating function 122e.

In this situation, the reasons for performing the regularizing process include the following, for example: First of all, to solve the original optimization problem, i.e., the optimization problem of the energy function E(x) in Expression (1), the energy function E(x) is calculated only for small number of output target images x by going through an approximation step or an additional step, because it would be impossible to check on all the candidates for the output target image x in a realistically-available calculation time period. Accordingly, the output target image x obtained in that manner does not exhibit a true minimum value of the energy function E(x), but exhibits a value approximate to the minimum value. In many purposes such as the use as a medical image, however, minor differences in signal values in detailed sections may not be a problem as long as a general tendency of the output target image x is correct. In those situations, it is not necessary to obtain an output target image x that yields a true minimum value of the objective function (i.e., the energy E(x) in Expression (1)). It is sufficient to obtain an output target image x that yields an approximate minimum value. Accordingly, it is acceptable to select an output target image x that satisfies conditions that should be fulfilled by a true output target image x, from among a plurality of candidates for the output target image x that each yield an approximate minimum value, i.e., from among the plurality of candidates for the output target image x that each exhibit an approximately appropriate value.

In other words, the regularization term is a term used for judging whether or not the expected conditions that need to be satisfied by a true output target image are fulfilled. In other words, by employing the image generating function 122e, the processing circuitry 150 adds, to the objective function, a term as the regularization term that exhibits a small value when an image is likely to be a true output target image and exhibits a large value as a penalty when an image is not likely to be the true output target image and further minimizes the sum of the objective function and the regularization term. As a result, such images that are not likely to be the true output target image and with which, nevertheless, the value of the objective function is close to 0 are eliminated, so that it is possible to obtain an image that is likely to be the true output target image and of which the value of the objective function is close to 0.

As the regularization term, an $L_0$ norm or an $L_1$ norm with which it is possible to obtain a sparse solution or an $L_2$ norm of which the calculation is simple may be used. The $L_2$ norm of an output image is often used for the purpose of uppressing dispersion of the overall output target image, for example.

However, when the regularization process is performed on an image to be output (the output target image) by simply using a predetermined norm, the quality of the output target image resulting from the reconstructing process may be degraded, contrary to the expectation, due to the regularization term introduced as the penalty term. In other words, because the regularization term serves as a term to suppress dispersion of the overall output target image, when a regularization parameter of large value is employed, the quality of the output target image resulting from the reconstructing process is affected.

The magnetic resonance imaging apparatus 100 according to the embodiments of the present disclosure is configured on the basis of the background described above. In other words, in the first embodiment, a norm related to a term in which the output target image x is multiplied by a local weighting coefficient W (a weighting coefficient expressing the likelihood of being an observation target region) introduced as a regularization term, as indicated in Expression (3) below.

$$E(x) = \sum_{c=1} \|y_c - A_c x\|_2 + \lambda \|Wx\|_2 \quad (3)$$

In Expression (3), the local weighting coefficient W is, as explained in detail later, a coefficient defined with respect to the pixel position of each of the pixels in the output target image. For example, the local weighting coefficient W is determined in such a manner that a weight applied to a pixel that is likely to be included in the observation target is smaller than a weight applied to a pixel that is not likely to be included in the observation target. As a result, the processing circuitry 150 is able to suppress artifacts in the background region, while improving the stability (robustness) of the output target image.

Figure 2:
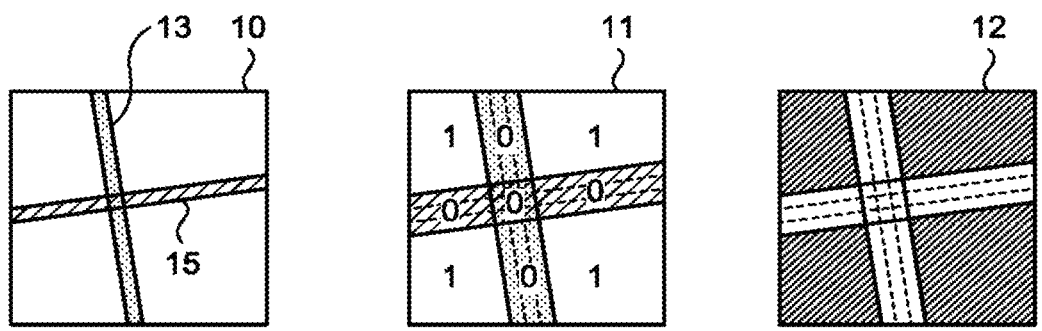

The technical feature described above will be explained with reference to FIGS. 2 and 3. FIGS. 2 and 3 are drawings for explaining an overview f an image generating process performed by the magnetic resonance imaging apparatus according to the first embodiment. With reference to FIGS. 2 and 3, an example (ASL-MRA) in which an image of blood vessels is rendered as an observation target will be explained.

The drawing square 10) on the left-hand side of FIG. 2 is a schematic drawing illustrating signal values of an output target image (the values corresponding to x in Expression (2) and x in Expression (3)). A rectangle 13 extending in the up-and-down direction and a rectangle 15 extending in the left-and-right direction each express a blood vessel region. Further, the rest of the area expresses the region of background signals. According to the ASL-MRA method, because the region other than the blood vessel regions is represented by background signals, the area of the background signals within the image is relatively large.

The drawing (the square 11) in the middle section of FIG. 2 is a schematic drawing illustrating values of the local weighting coefficient W. Details of a method for calculating the local weighting coefficient W will be explained later. In the square 11, for example, the areas indicated with the numeral "1" in the drawing are the regions in which the local weighting coefficient W is 1. In contrast, the areas indicated with the numeral "0" in the drawing are the regions in which the local weighting coefficient W is 0. The regions in which the local weighting coefficient W is 1 are the regions determined not to be observation target regions. In contrast, the regions in which the local weighting coefficient W is 0 are the regions determined to be observation target regions.

As understood from comparing the drawing on the left-hand side with the drawing in the middle section of FIG. 2, the actual blood vessel regions (the rectangle 1 extending in the up-and-down direction and the rectangle 15 extending in the left-and-right direction) do not necessarily need to match the regions determined to be the observation target regions (i.e., the regions in which the local weighting coefficient W is 0). Further, the judgment as to whether an area is an observation target region or not does not necessarily need to be precisely accurate, either. In other words, in the present example, it is sufficient even when the local weighting coefficient W only roughly indicates the position where the actual blood vessels are expected to be present.

The drawing (the square 12) on the right-hand side of FIG. 2 is a schematic drawing illustrating values of the regularization term (e.g., the second term of Expression (3)) according to the first embodiment. The values corresponding to x in Expression (3) are indicated in the square 10, whereas the values corresponding to the local weighting coefficient W in Expression (3) are indicated in the square 11. When the two sets f values are multiplied with each other, the blood vessel regions indicated as the rectangle 13 extending in the up-and-down direction and the rectangle 15 extending in the left-and-right direction are masked by the value "0" of the local weighting coefficient W, so that the contribution to the regularization term is equal to 0. In contrast, the regions other than the blood vessel regions are either masked by the value "0" of the local weighting coefficient W so that the contribution to the regularization term is equal to 0 or multiplied by the value "1" of the local weighting coefficient W so that the original signal value itself serves as a contribution to the regularization term. As understood from the drawing on the right-hand side of FIG. 2, the regularization term the second term of Expression (3)) according to the first embodiment is a penalty function with respect to the signal values in the regions other than the blood vessel regions.

In contrast, when a regularization term (e.g., the second term of Expression (2)) not involving the local weighting coefficient W was used, as understood from the drawing on the left-hand side of FIG. 2, a contribution attributed to the signal values in the blood vessel regions would be mixed with the contribution attributed to the signal values in regions other than the blood vessel regions. Because the blood vessel regions have a high level of signal strength, although the areas of the blood vessels account for a small portion of the whole, the contribution attributed to the signal values of the blood vessel regions would be reflected in the regularization term as the penalty function. As a result, the image quality would be degraded. In contrast, the processing circuitry 150 including the image generating function 122$e$ is able to enhance the quality of the output target image, by using the regularization term involving the local weighting coefficient W.

Next, the technical feature of the processing circuitry 150 including the image generating function 122$e$ and being able to enhance the quality of the output target image by using the regularization term involving the local weighting coefficient W will be explained from another aspect, with reference FIG. 3. For the sake of convenience in the explanation, an example in which an $L_1$ norm is used as a regularization term will be explained with reference to FIG. 3; however, the explanation is also applicable to situations using other norms.

In the example in FIG. 3, an example in which the number of pixel is 4×4=16 will be explained. Let us assume that the pixels indicated with hatching in a square 20 represent a blood vessel region.

As explained above, when no regularization process is performed (as in Expression (1)), because it is difficult to secure a sufficiently large search space for the output target image x in a realistically-available calculation time scale, approximate solutions of the output target image x include inappropriate solutions besides appropriate solutions. The drawing (the square 21) in the upper left section of FIG. 3 illustrates an obtained appropriate solution, whereas the drawings (the square 22 and the square 23) in the upper middle and the upper right sections of FIG. 3 illustrate examples of obtained inappropriate solutions.

Next, an example in which a regularization process not involving the local weighting coefficient W is performed will be explained. The upper section (the squares 21, 22, and 23) of FIG. 3 illustrates the situation in which the regularization process not involving the local weighting coefficient W is performed (e.g., when the $L_2$ norm in Expression (2) is changed to an $L_1$ norm). In that situation, when all the pixel values are added up, the total pixel value (the $L_1$ norm) of each of the squares 21, 22, and 23 is 44. Accordingly, the squares 21, 22, and 23 are equivalent from the viewpoint of the regularization term, and it is impossible to distinguish the solutions from one another. Accordingly, the processing circuitry 150 is not able to eliminate inappropriate solutions.

Next, an example in which a regularization process using the local weighting coefficient W is performed will be explained. The lower section (squares 24, 25, and 26) of FIG. 3 illustrates the situation in which the regularization process involving the local weighting coefficient W is performed (e.g., when the $L_2$ norm in Expression (3) is changed to an $L_1$ norm). In that situation, for example, in each of the squares 21, 22, and 23, the region indicated with the hatching in the square 20 is masked by the local weighting coefficient W, so that the contribution to the regularization term is as indicated in each of the squares 24, 25, and 26. In that situation, the regularization term in each of the squares is calculated as "9" for the drawing (the square 24) in the lower left section of FIG. 3, as "23" for the drawing (the square 25) in the lower middle section of FIG. 3, and as "29" for the drawing (the square 26) in the lower right section of FIG. 3. Accordingly, when the regularization term using the local weighting coefficient W is performed, the drawing in the middle section and the drawing on the right-hand side of FIG. 3 are excluded from the candidates for the solution because the penalty function has a large value. Thus, the image in the drawing on the left-hand side of FIG. 3 is selected as a final output image. The image quality is therefore improved in this manner.

To summarize the above configuration, by employing the estimating function 122b, the processing circuitry 150 calculates, at the first stage, the local weighting coefficient W by using the more simple method compared to the optimization process at the subsequent stages. After that, at the second stage, the processing circuitry 150 generates the output target image by performing the regularization process while using the regularization term that involves the calculated local weighting coefficient W, by employing the image generating function 122e. As a result, the processing circuitry 150 is able to suppress the artifacts in the background region, while improving the stability (robustness) of the output target image.

Next, processing procedures performed by the magnetic resonance imaging apparatus according to the first embodiment will be explained, with reference to FIGS. 4 to 7, while also referring to FIGS. 8 to 15, as necessary.

In the following sections, with reference to the flowcharts, an example will be explained in which a sequence is executed to acquire, while performing undersampling, two types of time-series k-space data representing, for example, an image (a tag image) in which the blood in a specific region is excited and labeled such as images acquired by implementing the ASL-MRA method and another image (a control image) in which no blood is excited and labeled, so as to render the blood vessels by performing an image reconstructing process through a parallel imaging process; however, possible embodiments are not limited to this example.

Figure 4:
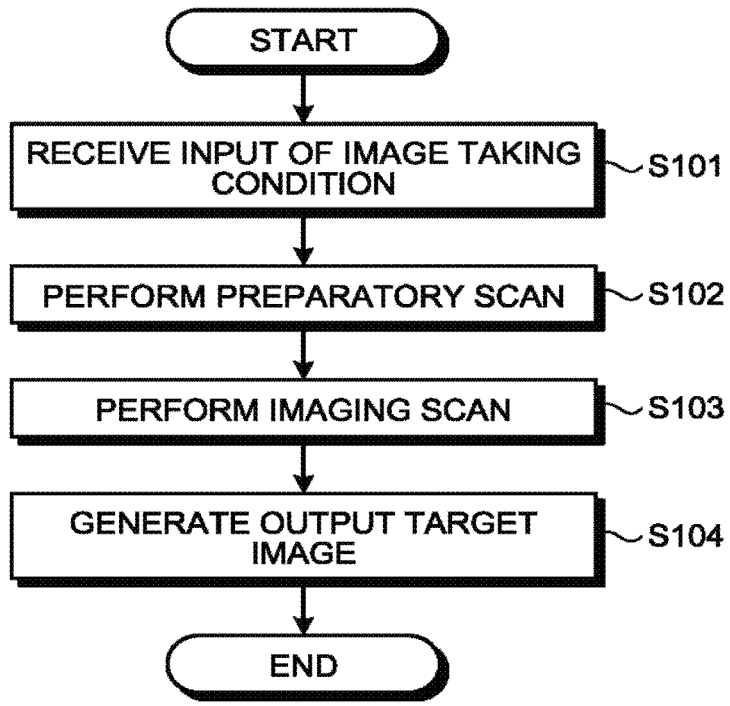
FIGS. 4 to 7 are flowcharts illustrating processing procedures performed by the magnetic resonance imaging apparatus according to the first embodiment.

FIGS. 4 to 7 are flowcharts illustrating processing procedures performed by the magnetic resonance imaging apparatus according to the first embodiment. In FIG. 4, at first, the processing circuitry 150 receives an input of an image taking condition from the operator by employing the controlling function 126 (step S101). Subsequently, by employing the obtaining function 122d, the processing circuitry 150 generates sequence information on the basis of the image taking condition input from the operator and further controls the execution of a preparatory scan by transmitting the generated sequence information to the sequence controlling circuitry 110. The sequence controlling circuitry 110 performs the preparatory scan (step S102). In this situation, the preparatory scan includes, for example, a scan to acquire a position-determining-purpose image, a shimming scan to correct non-uniformity of the static magnetic field, a scan to acquire the sensitivity distribution information, and/or the like.

When the preparatory scan has been finished, the processing circuitry 150 subsequently generates, by employing the obtaining function 122d, sequence information on the basis of the image taking condition input from the operator and controls the execution of an imaging scan to acquire an output target image (e.g., an image output for a diagnosis purpose) by transmitting the generated sequence information to the sequence controlling circuitry 110 (step S103). When having received the sequence information from the processing circuitry 150, the sequence controlling circuitry 110 executes pulse sequences while performing undersampling. More specifically, the sequence controlling circuitry 110 executes a first pulse sequence and a second pulse sequence. In this situation, the first pulse sequence is a pulse sequence to apply a labeling pulse to a labeled region within the image taking region, i.e., a pulse sequence related to the tag image. The second pulse sequence is a pulse sequence to apply no labeling pulse. In this situation, the sequence controlling circuitry 110 executes at least one selected from between the first and the second pulse sequences while performing undersampling. By employing the obtaining function 122d, the processing circuitry 150 obtains first k-space data by using the first pulse sequence and obtains second k-space data by using the second pulse sequence. In the present example, the first k-space data is the k-space data for generating the tag image. The second k-space data is the k-space data for generating the control image. Further, the data obtained in these situations is time-series data. In other words, by employing the obtaining function 122d, the processing circuitry 150 obtains the time-series k-space data in correspondence with a plurality of channels, as the k-space data. In this manner, the sequence controlling circuitry 110 acquires the k-space data by executing the pulse sequences while performing the undersampling.

In the first embodiment, the sequence controlling circuitry 110 acquires the time-series k-space data by thinning out the data according to the reduction factor R (the thinning-out rate of the sampling data with respect to the full sampling data). In other words, the quantity of pieces of time-series k-space data acquired by the sequence controlling circuitry 110 is 1/R times as many as the quantity of pieces of data acquired in the full sampling. More specifically, as the k-space data, the sequence controlling circuitry 110 acquires as many signal points as a value calculated as "the quantity of the signal points in the read-out (RO) direction×the quantity of the signal points in the phase-encoding (PE) direction×the quantity of the signal points in the slice-encoding (SE) direction×the quantity of frames in the temporal direction reduction factor R×the quantity of channels".

After that, by employing the image generating function 122e, the processing circuitry 150 generates an image to be output, by using either the time-series k-space data acquired at step S103 or the time-series k-space data corresponding to the plurality of channels that was acquired at step S103 and stored in the storage circuitry 123 (step S104). The generated image to be output may be stored in the storage circuitry 123 or may be displayed on the display 125, as necessary.

The process at step S104 according to the first embodiment will be explained in detail, with reference to FIG. 5.

First, by employing the sensitivity map generating function 122a, the processing circuitry 150 generates a sensitivity map providing sensitivity distribution information of each of the coils (step S201). The processing circuitry 150 including the sensitivity map generating function 122a generates a sensitivity map of each of the coils on the basis of the data acquired in either the preparatory scan or the main scan. Subsequently, the processing circuitry 150 performs a process by employing the unfolding function 122c.

By employing the estimating function 122b, the processing circuitry 150 calculates a local weighting coefficient W from the tag-image generating-purpose data and the control-image generating-purpose data (step S202). In this situation, the tag-image generating-purpose data and the control-image generating-purpose data are each four-dimensional (3D+t (time series); hereinafter, "4D") k-space data. For each image, as many pieces of 4D k-space data as the quantity of channels are prepared. When the ASL-MRA method is used, the local weighting coefficient W is a value expressing the likelihood of being a blood vessel region of each of the pixels in the x-space and may be, for example, a value ranging from 0 to 1 expressing the likelihood of being a blood vessel region of each of the pixels in the 3D x-space. In other words, the processing circuitry 150 including the estimating function 122b calculates the local weighting coefficient W expressing the likelihood of being a blood vessel region of each of the pixels in the 3D x-space, on the basis of the two types of 4D (3D+t (time series)) k-space data, namely, the tag-image generating-purpose data and the control-image generating-purpose data. In other words, by employing the estimating function 122b, the processing circuitry 150 estimates whether or not the pixel position of each of the pixels in the output target image is included in the observation target region, on the basis of the data generated by using the k-space data. In this situation, the data generated by using the k-space data is, more specifically, the data generated by using the first k-space data (the tag-image generating-purpose data) and the second k-space data (the control-image generating-purpose data). On the basis of the results estimated by employing the estimating function 122b, the processing circuitry 150 applies a weight to the regularization term.

Figure 6:
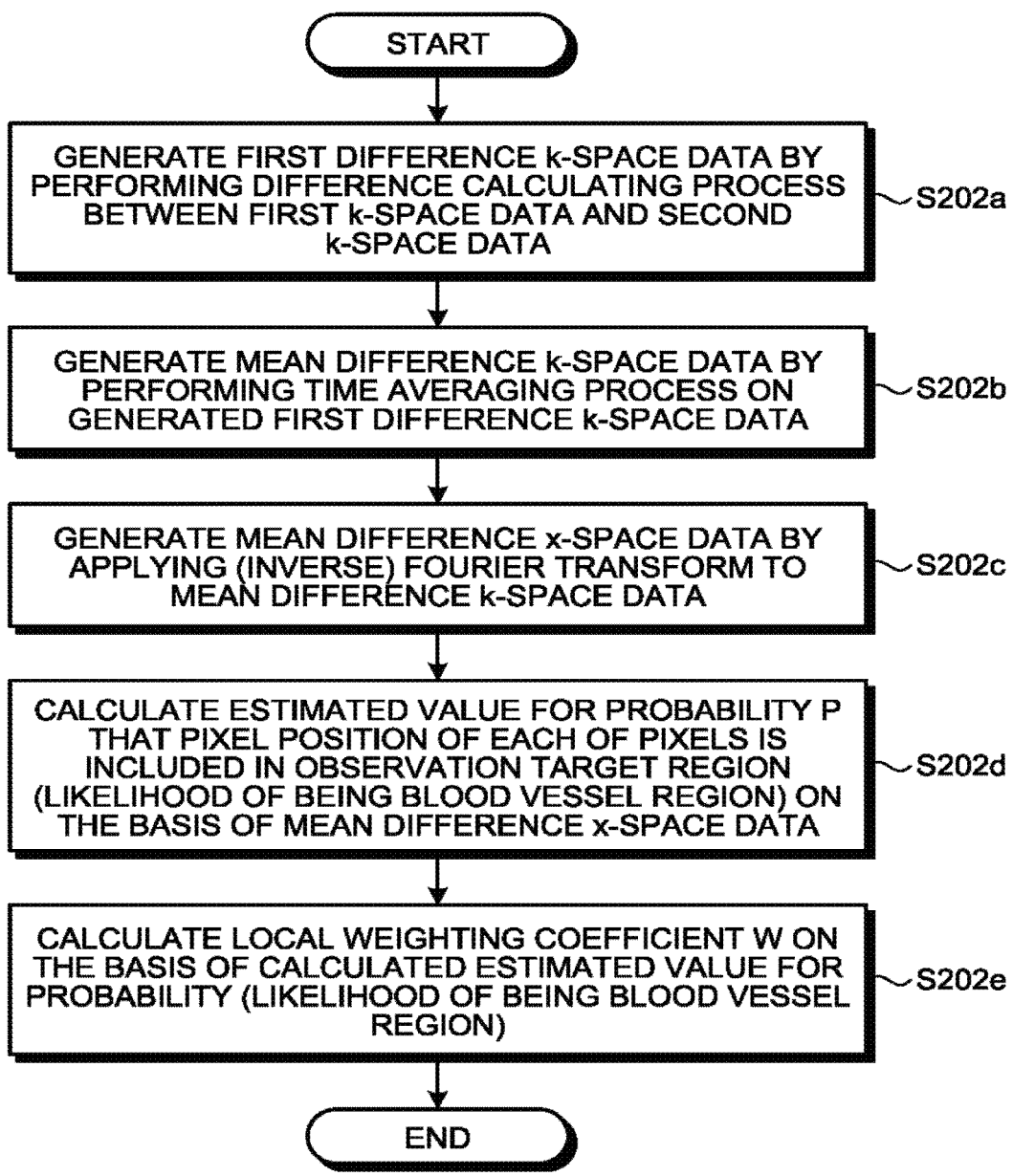

FIG. 6 is a flowchart illustrating a detailed processing procedure at step S202. First, by employing the estimating function 122b, the processing circuitry 150 generates 4D k-space difference image data (first difference k-space data) by performing a difference calculating process between the tag-image-purpose data (the first k-space data) and the control-image generating-purpose data (the second k-space data), which are each the 4D k-space data (step S202a). In this situation, because the first k-space data and the second k-space data are each a piece of complex-number data, the process performed at step S202a is a complex difference calculating process. Further, the first k-space data and the second k-space data are, for example, each time-series data using, as the axes thereof, the RO direction in the k-space, the PE direction in the k-space, the SE direction in the k-space, and the time. As many pieces of first k-space data as the quantity of channels and as many pieces of second k-space data as the quantity of channels are prepared.

Further, the first k-space data (the tag-image-purpose data) and the second k-space data (the control-image-purpose data) may be pieces of data that are acquired as being thinned out while using mutually-the-same sampling pattern or may be pieces of data that are acquired as being thinned out while using mutually-different sampling patterns and are subsequently changed to have mutually-the-same sampling pattern.

Subsequently, by employing the estimating function 122b, the processing circuitry 150 generates mean difference k-space data by performing a time averaging process on the generated first difference k-space data (step S202b). When the sampling patterns of the first k-space data and the second k-space data are each such a pattern that a projection in the time axis direction fills the entire k-space, the mean difference k-space data is k-space data corresponding to the full sampling. At this point in time, the mean difference k-space data is no longer time-series data, but is data in which pieces of k-space data having a size corresponding to RO×PE×SE are present in a quantity equal to the quantity of channels. The time averaging process may be performed on the pieces of k-space data corresponding to all of the times or may be performed only on pieces of k-space data corresponding to certain times during a certain time period. Further, an adding process may be performed instead of the averaging process.

Subsequently, by employing the estimating function 122b, the processing circuitry 150 generates mean difference x-space data by performing a three-dimensional (inverse) Fourier transform on the mean difference k-space data calculated at step S202b (step S202c). In other words, the mean difference x-space data is non-time-series data that was generated by using the time-series k-space data. Because the mean difference k-space data calculated at step S202b is the data corresponding to the full sampling, the mean difference x-space data obtained at step S202c has little aliasing. Further, because the difference between the tag-image-purpose data and the control-image-purpose data is calculated at step S202a, the mean difference x-space data rendered at step S202c represents a blood signal.

The processing procedure at steps S202a to S202c described in the first embodiment is merely an example. Alternatively, it is also acceptable to perform, at first, a time averaging process on the tag-image-purpose data and the control-image-purpose data at step S202b and to subsequently perform the complex difference calculating process at step S202a, before performing the process at step S202c. In another example, it is also acceptable to perform, at first, the time averaging process at step S202b and to subsequently perform the image transformation process at step S202c, before performing the difference calculating process at step S202a.

After that, by employing the estimating function 122b, the processing circuitry 150 judges the likelihood of being a blood vessel region for each of the pixels in the x-space, by using the mean difference x-space data of all the channels calculated at step 202c (step S202d). In other words, by employing the estimating function 122b, the processing circuitry 150 estimates whether or not the pixel position of each of the pixels in the output target image is included in the observation target region, on the basis of the space data that was generated by using the time-series k-space data and that has no time axis.

Figure 7:
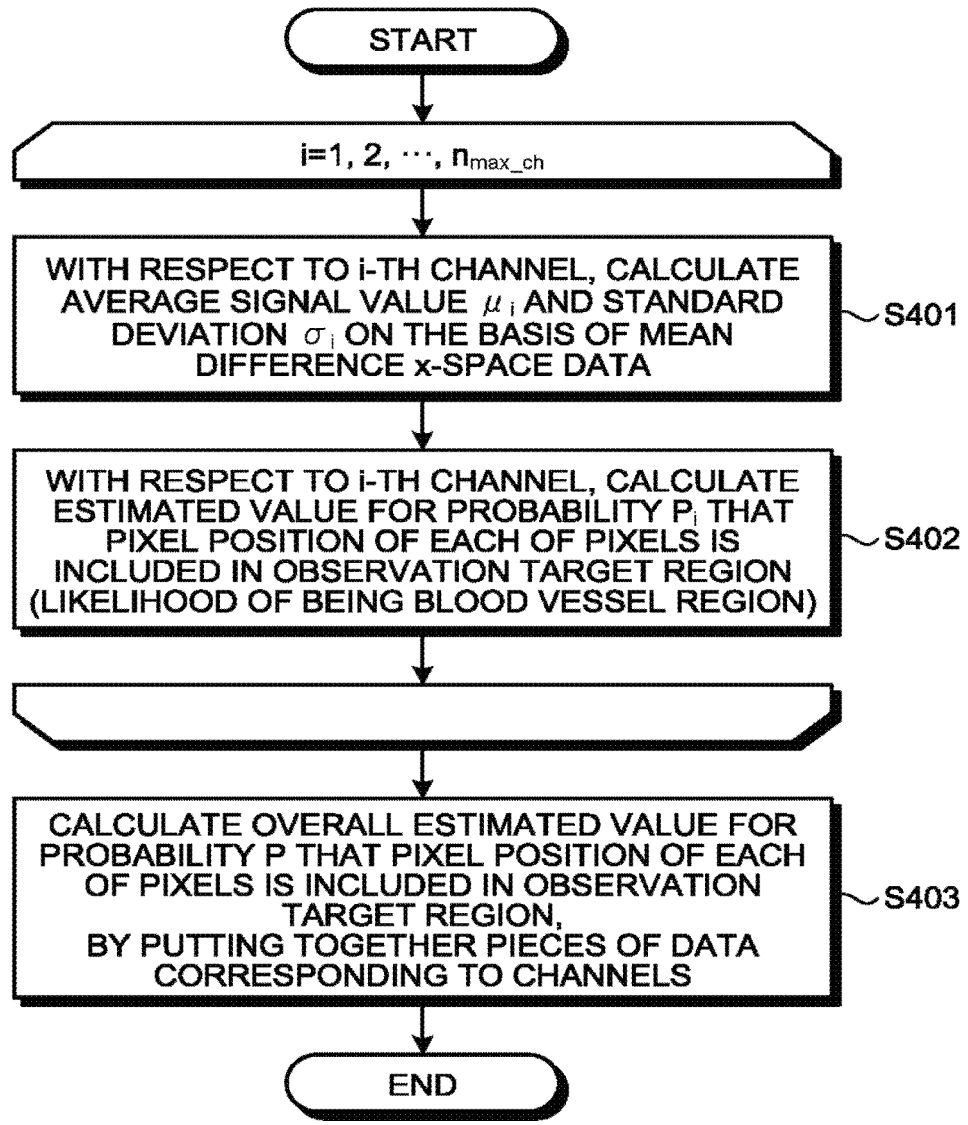

FIG. 7 is a flowchart illustrating a detailed processing procedure at step 7202d. The processing circuitry 150 including the estimating function 122b performs the process at steps S401 and S402 for each of the channels. In other words, the processing circuitry 150 including the estimating function 122b repeatedly performs the process at steps S401 and S402, for each of the channels of which the total quantity is expressed as $n_{max\_ch}$. The process at steps S401 and S402 may be performed for each of the channels in a serial manner or in a parallel manner. In the following sections, an example will be explained in which the process at steps S401 and S402 is performed for each of the channels; however, it is also acceptable to perform the process at steps S401 and S402 after putting together the pieces of data corresponding to the plurality of channels, in advance.

At first, by employing the estimating function 122b, the processing circuitry 150 estimates, with respect to an i-th channel, a noise distribution on the basis of the mean difference x-space data calculated at step S202c. More specifically, with respect to the i-th channel, by employing the estimating function 122b, the processing circuitry 150 identifies an air region that is a region having a low signal value in the mean difference x-space data and further calculates an average value $\mu_i$ and a standard deviation $\sigma_i$ of the signal values of the set of pixels, on the basis of the identified mean difference x-space data (step S401). Noise occurring in air regions is known to have a Gaussian distribution in a complex space. The air region may be identified as an arbitrary region that is set in advance or may be identified by using the acquired data obtained from the preparatory scan or the imaging scan.

After that, with respect to the i-th channel, by employing the estimating function 122b, the processing circuitry 150 calculates an estimated value for probability $P_i$ that the pixel position of each of the pixels is included in the observation target region (the likelihood of being a blood vessel region) (step S402). In the most typical example, by employing the estimating function 122b, the processing circuitry 150 uses, for example, the noise distribution calculated at step S401 as a reference level and, when the signal value of a pixel in the mean difference x-space data calculated at step S202c is smaller than the reference level, the processing circuitry 150 determines that the pixel represents a background region and, when the signal value of a pixel in the mean difference x-space data is larger than the reference level, the processing circuitry 150 determines that the pixel represents an imaged object region (the observation target region). In this manner, the processing circuitry 150 judges whether the signal value of each of the pixels in the mean difference x-space data represents the background region or the imaged object region (the observation target region). The judgment result does not necessarily have to be the binary judgment indicating whether each of the pixels represents the observation target region or not. Further, in another example, it is acceptable to configure the processing circuitry 150 so as to calculate, by employing the estimating function 122b, an average value $\mu_i$ and a standard deviation $\sigma_i$ of the signal values of the set of pixels from the entire image at step 3401 and to subsequently calculate an estimated value for the probability $P_i$ that the pixel position of each of the pixels is included in the observation target region on the basis of the calculated average value $\mu_i$ and the standard deviation $\sigma_i$ at step S402.

Figure 8:
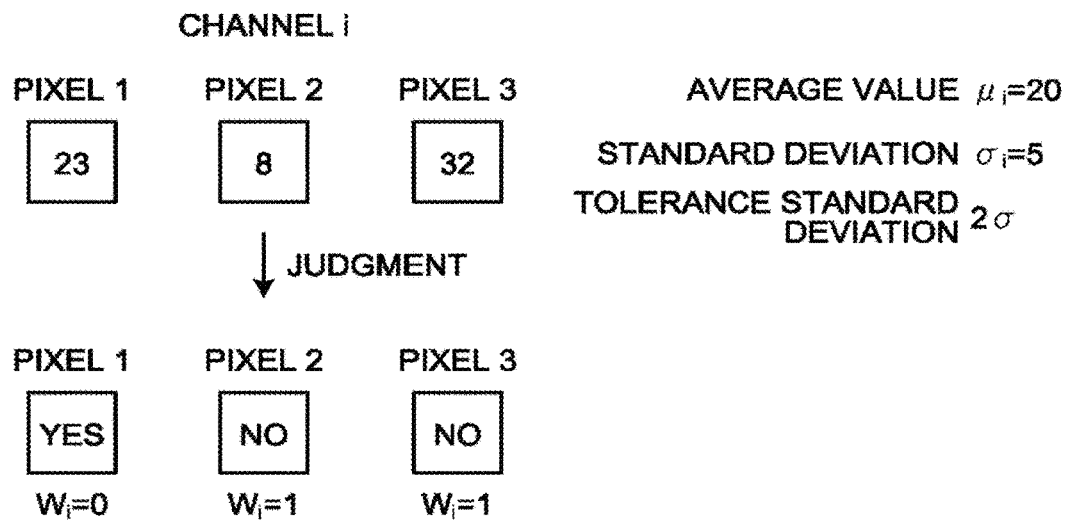
Figure 9:
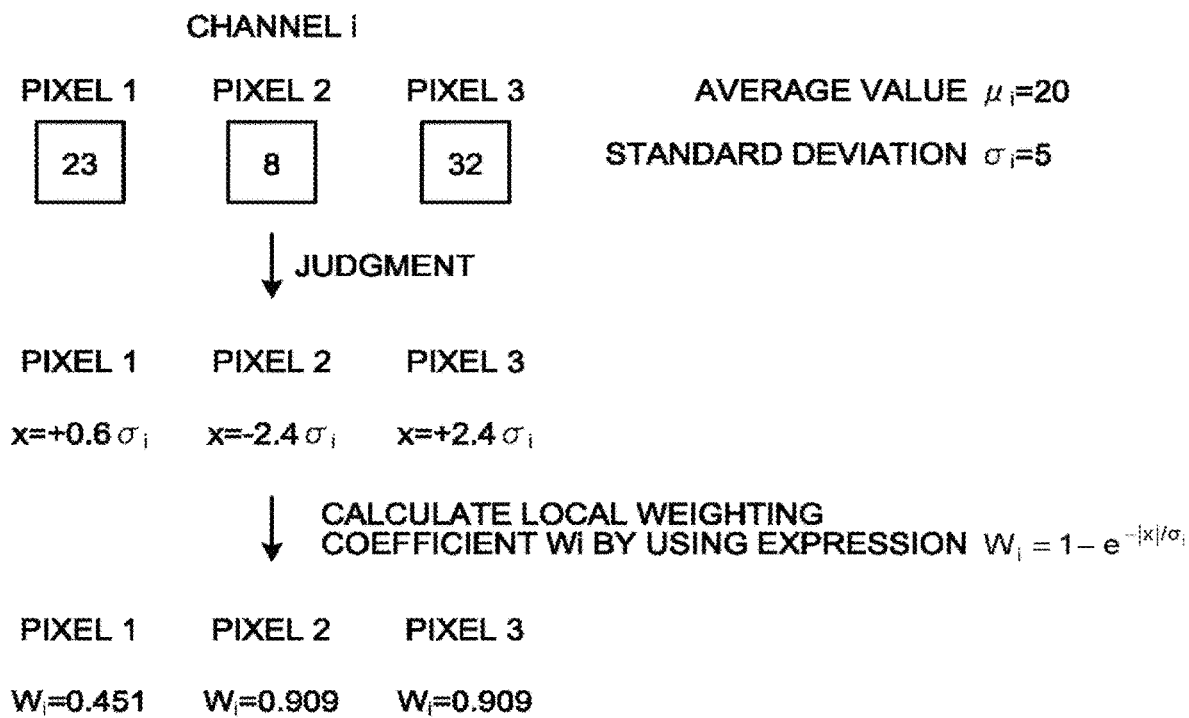

FIGS. 8 and 9 illustrate typical specific examples of the process at step S402. FIGS. 8 and 9 are drawings for explaining the process of calculating the local weighting coefficient $W_i$ (and the probability $P_i$) performed by the magnetic resonance imaging apparatus according to the first embodiment. With reference to FIGS. 8 to 11, an example will be explained in which the average value $\mu_i$ and the standard deviation $\sigma_i$ of the signal values of the set of pixels are calculated from the entirety of the mean difference x-space data, for the purpose of simplifying the explanation. However, based on the same concept, the explanation is also applicable to a situation where the processing method according to one of the embodiments is implemented by which an average value $\mu_i$ and a standard deviation $\sigma_i$ of the signal values of a set of pixels are calculated from the data of the air region within the mean difference x-space data, so as to further calculate the local weighting coefficient $W_i$ on the basis of the calculated average value and standard deviation. Further, with reference to FIGS. 8 to 11, the example in which the image data uses real numbers is explained for the purpose of simplifying the explanation; however, the image data in actuality is data using complex numbers. It is possible to apply the same concept to the image data in actuality that uses complex numbers by, for example, applying the same concept to absolute values of the complex numbers or by applying the same concept to the real part and to the imaginary part of the complex numbers.

With reference to FIG. 8, at first, an example will be explained in which a binary judgment is made to select from between 0 or 1, as a method for calculating the local weighting coefficient $W_i$ (or the probability $P_i$ of being included in the observation target region) of the i-th channel.

In the example illustrated in FIG. 8, the processing circuitry 150 including the estimating function 122b judges whether each of the pixels represents the observation target region or not, by judging, for each of the pixels, whether the pixel value falls within a predetermined tolerance standard deviation, compared to the average value $\mu_i$ of the signal values of the set of pixels.

For instance, in the example in FIG. 8, with respect to the i-th channel, because the average value $\mu_i$=20 for the set of pixels, the standard deviation $\sigma_i$=5 for the set of pixels, and the tolerance standard deviation 2σ are fled, the reference level for a pixel value y to be included in the observation target region can be expressed as 20−5×2≤y≤20+5×2. Accordingly, by employing the estimating function 122b, the processing circuitry 150 determines that any pixel falling in the range of 10≤y≤30 represents the observation target region. Thus, the processing circuitry 150 determines that pixel 1 having a pixel value of 23 to be "YES", which means that the pixel is in the observation target region. Further, the processing circuitry 150 determines pixel 2 having a pixel value of 8 and pixel 3 having a pixel value of 32 to be "NO", which means that the pixels are not in the observation target region. In the present example, because the probability $P_i$ that the pixel position of each of the pixels represents the observation target is binarized and expressed with either C or 1, the processing circuitry 150 including the estimating function 122b calculates $P_i$=1 for pixel 1 and $P_i$=0 for pixel and pixel 3.

Subsequently, with respect to each of the pixels, the processing circuitry 150 including the estimating function 122b determines the local weighting coefficient $W_i$ on the basis of the probability $P_i$ that the pixel position of the pixel represents the observation target. In an example, by employing the estimating function 122b, the processing circuitry 150 determines the local weighting coefficient $W_i$ on the basis of the expression $W_i=1-P_i$. In other words, with respect to each of the pixels, the local weighting coefficient $W_i$ applied to the regularization term is equal to 0 when the pixel position of the pixel is included in the observation target region and is equal to 1 when the pixel position of the pixel is not included in the observation target region. For example, by employing the estimating function 122b, the processing circuitry 150 calculates $W_i=0$ for pixel 1 and calculates $W_i=1$ for pixel 2 and pixel 3.

With reference to FIG. 9, another example a calculation method will be explained in which, although similar to FIG. 8, a local weighting coefficient $W_i$ and a value of the probability $P_i$ of being included in the observation target region are calculated by using a continuous amount, instead of the binary judgment.

In the example in FIG. 9, the processing circuitry 150 including the estimating function 122b calculates, for each of the pixels, an amount x indicating how much the pixel value is different from the average value $\mu_i$ of the signal values of the set of pixels. For example, in FIG. 9, with respect to the i-th channel, because the average value $\mu_i=20$ for the set of pixels and the standard deviation $\sigma_i=5$ for the set of pixels are satisfied, pixel 1 having a pixel value of 23 is different from the average by $x=(23-20)\div 5=+0.6\sigma_i$. Similarly, pixel 2 and pixel 3 are each different from the average by $x=-2.4\sigma_i$ and $x=+2.4\sigma_i$, respectively. After that, the processing circuitry 150 including the estimating function 122b calculates the probability $P_i$ that the pixel position of each of the pixels represents the observation target by using the expression $P_i=\exp(-abs(x)/\sigma_i)$ as a relative value corresponding to when $x=0$ is satisfied, on the assumption that the central limit theorem is true and that the value exponentially decreases as getting away from the average value.

After that, the processing circuitry 150 including the estimating function 122b determines, for each of the pixels, the local weighting coefficient $W_i$ on the basis of the probability $P_i$ that the pixel position of the pixel represent the observation target. In other words, the weight applied to the regularization term is a value calculated on the basis of the estimated value of the probability that the pixel position of each of the pixels is included in the observation target. In an example, by employing the estimating function 122b, the processing circuitry 150 calculates the local weighting coefficient $W_i$ on the basis of the expression $W_i=1-P_i$. In this situation, $W_i=1-\exp(-abs(x)/\sigma i)$ is true. In other words, $W_i=0.451$ is calculated for pixel 1, $W_i=0.909$ is calculated for pixel 2, and $W_i=0.909$ is calculated for pixel 3.

Returning to the description of FIG. 7, by employing the estimating function 122b, the processing circuitry 150 puts together the judgment results for the channels obtained at step S402 (step S403). In other words, the weight applied to the regularization term is the value calculated by putting together the values each of which is calculated for a different one of the channels that are units of acquisition of the k-space data. As for the method for putting the values together, the values for each of the pixels may simply be added together with respect to all the channels or tray be calculated by weighted addition. Alternatively, it is acceptable to use any other method for putting the values together. FIGS. 10 and 11 illustrate specific examples of the process of putting together the judgment result corresponding to the channels. FIGS. 10 and 11 are drawings for explaining the process of calculating the local weighting coefficient performed by the magnetic resonance imaging apparatus according to the first embodiment.

FIG. 10 illustrates the process of putting the local weighting coefficients together, when the values of the local weighting coefficient $W_i$ are binarized. In the same manner as in the example in FIG. 8, by employing the estimating function 122b, the processing circuitry 150 determines the local weighting coefficient $W_i$ of each of the charnels, on the basis of an average value $\mu_i$, a standard deviation $\sigma_i$, and a tolerance standard deviation of the set of pixels of the channel. By employing the estimating function 122b, the processing circuitry 150 makes an overall judgment and, in an example, calculates an average value of the local weighting coefficients $W_i$ corresponding to the channels, as the value of the local weighting coefficient W. For example, with respect to pixel 1, the local weighting coefficient of the first channel is $W_1=0$, the local weighting coefficient of the second channel is $W_2=0$, and the local weighting coefficient of the third channel is $W_3=1$. Accordingly, by employing the estimating function 122b, the processing circuitry 150 calculates the local weighting coefficient W of pixel 1 as $W=(W_1+W_2+W_3)/3=1/3$. Similarly, by employing the estimating function 122b, the processing circuitry 150 calculates the local weighting coefficient W of pixel 2 and pixel 3 as $W=1$ and $W=2/3$, respectively.

Possible embodiments are not limited to the example described above. For instance, by employing the estimating function 122b, the processing circuitry 150 may calculate a value of the local weighting coefficient W as a sum, a maximum value, or a minimum value, instead of as an average of the local weighting coefficients W corresponding to the channels. Alternatively, the processing circuitry 150 may calculate a value of the local weighting coefficient W by connecting together the local weighting coefficients $W_i$ corresponding to the channels by using a logic operation of "AND" or "OR". In another example, by employing the estimating function 122b, the processing circuitry 150 may calculate a weighted linear sum of the local weighting coefficients $W_i$ corresponding to the channels, by applying a weight reflecting a value indicating the level of sensitivity of each of the channels.

FIG. 11 illustrates an example of a method for calculating the local weighting coefficient $W_i$ by which the calculation is performed by using a continuous amount. By employing the estimating function 122b, the processing circuitry 150 calculates the local weighting coefficient $W_i$ of each of the channels by using the same method as in FIG. 9. Subsequently, by employing the estimating function 122b, the processing circuitry 150 calculates, in an example, a root mean square of the local weighting coefficients $W_i$ of the channels as a value of the local weighting coefficient W. Alternatively, in another example, by employing the estimating function 122b, the processing circuitry 150 may subsequently calculate the maximum value or the minimum value among the local weighting coefficients $W_i$ of the channels, as a value of the local weighting coefficient W.

Figure 12:
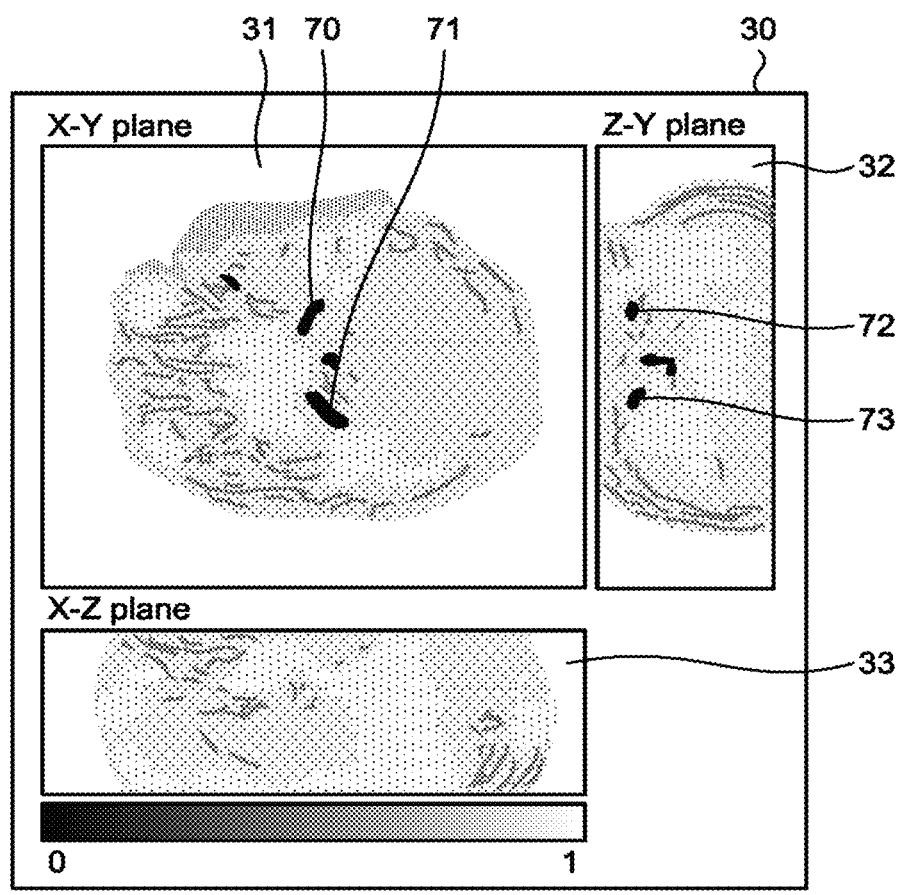

FIG. 12 illustrates an example of the local weighting coefficient W calculated in this manner by the processing circuitry 150 including the estimating function 122b. FIG. 12 is a drawing for explaining the process of calculating the local weighting coefficients performed by the magnetic resonance imaging apparatus according to the first embodiment. In a panel 30, values of local weighting coefficients on a plurality of cross-sectional planes are indicated. An image 31, an image 32, and an image 33 indicate local weighting coefficients W calculated on an X-Y plane, a Z-Y plane, and an X-Z plane, respectively. Regions 70, 71, 72, and 73 each have a small value as the local weighting coefficient 51 and thus each represent an observation target region (a blood vessel region). In contrast, the other regions each have a large value as the local weighting coefficient W and thus each represent a region other than the observation target region.

Returning to the description of FIG. 6, by employing the estimating function 122b, the processing circuitry 150 eventually calculates a local weighting coefficient to be used in the unfolding process, on the basis of the calculation results obtained at step S202d (step 3202e). More specifically, the processing circuitry 150 including the estimating function 122b may perform a transformation process at step S202e by using, for example, a sigmoid function or an exponential function. The local weighting coefficients W exhibit values as follows: The more likely a region represents the background region, the closer the value of the local weighting coefficient W is to 1; and the more likely a region represents a blood vessel region, the closer the value of the local weighting coefficient W is to 0.

Figure 5:
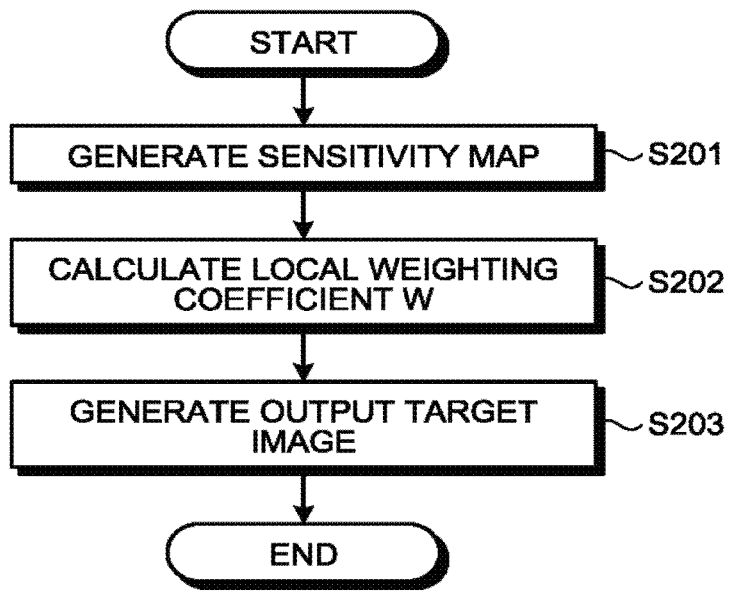

Returning to the description of FIG. 5, when the processing circuitry 150 including the estimating function 122b has finished calculating the local weighting coefficients W, at step S202, for the tag image and for the control image, the processing is handed over to the unfolding function 122c and the image generating function 122e. In other words, the processing circuitry 150 performs the processes that follow, by employing the unfolding function 122c and the image generating function 122e.

After that, by employing the unfolding function 122c and the image generating function 122e, the processing circuitry 150 generates post-reconstruction x-space data for the tag image and for the control image and further generates an image to be output on the basis of the generated x-space data (step S203). More specifically, the processing circuitry 150 including the unfolding function 122c and the image generating function 122e generates a piece of post-construction tag image x-space data and a piece of post-construction control image x-space data that are free of aliasing, by using the tag-image-purpose k-space data obtained by the obtaining function 122d at step S103, the two types of 4D (3D+t) k-space data from the control-image-purpose k-space data, the sensitivity maps obtained by the sensitivity map generating function 122a at step S201, and the weighting coefficient obtained by the estimating function 122b at step S202. The processing circuitry 150 including the unfolding function 122c and the image generating function 122e performs the reconstructing process by minimizing the energy function in Expression (4).

$$E(x) = \sum_{c=1} \|y_{Tc} - A_{Tc}x_T\|_2 + \sum_{c=1} \|y_{Oc} - A_{Oc}x_O\|_2 + \lambda \|W \cdot (x_T - x_O)\|_2 \quad (4)$$

In Expression (4), the subscript T is a subscript indicating the first image (the tag image). The subscript C is a subscript indicating the second image (the control image). Further, $x_T$ denotes the first image, whereas $x_O$ denotes the second image. Further, $y_{Tc}$ denotes the first k-space data (the tag-image-purpose k-space data) related to the c-th coil, whereas $y_{Oc}$ denotes the second k-space data (the control-image-purpose k-space data) related to the c-th coil. Further, E(x) denotes the energy function. In this situation, $x=(x_T,x_O)$ is satisfied, i.e., x denotes the first image and the second image. In other words, the energy function is a function that uses both the first image $x_T$ and the second image $x_c$ as arguments thereof.

Further, the operator $A_{Tc}$ is an operator that can be expressed as $A_{Tc}=\Gamma_c \cdot FT \cdot S_{Tc}$, where the sensitivity of the c-th coil with respect to the first image is expressed as $S_{Tc}$, while a Fourier transform is expressed as FT, and a sampling operation in the pulse sequence related to the first image is expressed as $\Gamma_c$. The operator $A_{Oc}$ is an operator that can be expressed as $A_{Oc}=\Gamma_O \cdot FT \cdot S_{Oc}$, where the sensitivity of the c-th coil with respect to the second image is expressed as $S_{TO}$, while a Fourier transform is expressed as FT, and a sampling operation in the pulse sequence related to the second image is expressed as $\Gamma_O$.

Further, W denotes the local weighting coefficient generated by the processing circuitry 150 while employing the estimating function 122b. Further, the first term of Expression (4) is an objective function related to a reconstructing condition $y_{Tc}=A_{Tc}x_T$ of the first image. The second term of Expression (4) is an objective function related to a reconstructing condition $y_{Oc}=A_{Oc}x_O$ of the second image. The third term of Expression (4) is a regularization term. In other words, by employing the image generating function 122e, the processing circuitry 150 generates the output target image by adding, to the objective function, the norm of the vector obtained by multiplying, for each of the pixels, the value of each of the pixels in the output target image by the weight applied to the regularization term, as the regularization term, and further calculating the output target image so as to minimize the sum of the objective function and the regularization term.

In this situation, as a process at the first stage, the processing circuitry 150 performs the regularization process by employing the image generating function 122e, so as to generate the first image (the tag image) by performing a reconstructing process on the first k-space data (the tag-image-purpose k-space data) and to generate the second image (the control image) ho performing a reconstructing process on the second k-space data (the control-image-purpose k-space data). In this situation, the first image and the second image are generated by being simultaneously optimized by Expression (4). Subsequently, as a process at the second stage, by employing the image generating function 122e, the processing circuitry 150 generates the output target image (the blood vessel image) on the basis of the first image and the second image. More specifically, by employing the image generating function 122e, the processing circuitry 150 performs a difference calculating process between the first image and the second image and generates the output target image (the blood vessel image), which is a difference image.

Figure 13:
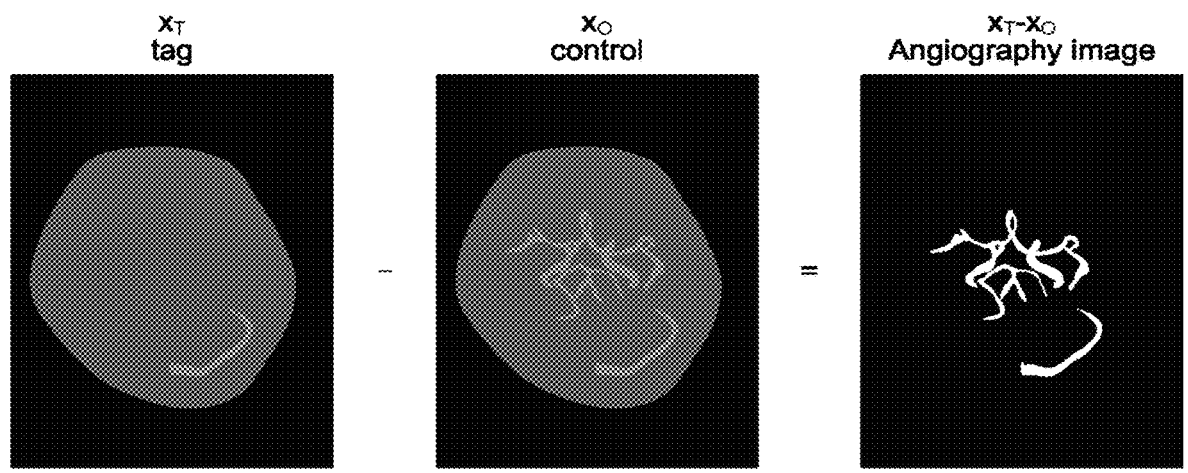
FIGS. 13 and 14 are drawings for explaining the image generating process performed by the magnetic resonance imaging apparatus according to the first embodiment.
Figure 14:
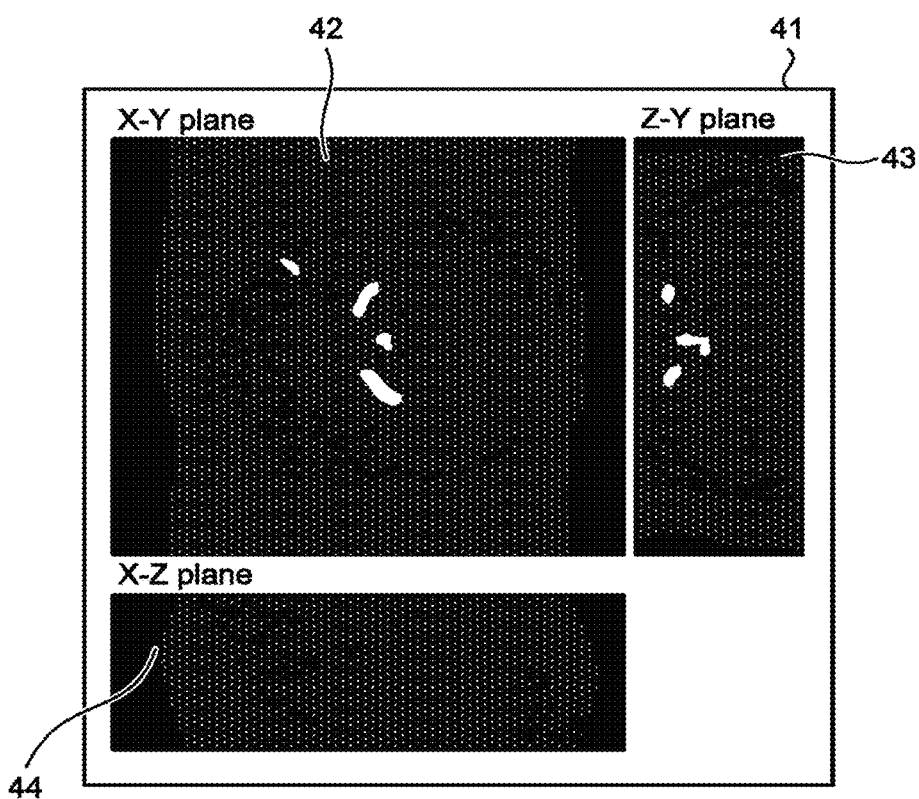

FIGS. 13 and 14 illustrate examples of the output target image (the blood vessel image) generated in the manner described above. FIGS. 13 and 14 are drawings for explaining an image generating process performed by the magnetic resonance imaging apparatus according to the first embodiment.

FIG. 13 schematically illustrates examples of images generated by a reconstructing process according to the embodiment. The drawing on the left-hand side of FIG. 13 illustrates the first image (the tag image). The drawing in the middle section of FIG. 13 illustrates the second image (the control image). By employing the image generating function 122e, the processing circuitry 150 obtains the output target image (the blood vessel image which is an angiography image) illustrated in the right-hand side of FIG. 13, by subtracting the second image (the drawing in the middle section of FIG. 13) from the first image (the drawing in the left-hand side of FIG. 13). In the present example, the output target image is an image in which only the blood vessels serving as an observation target are rendered in high contrast.

FIG. 14 illustrates examples of the output target image generated in the manner described above. A panel 41 illustrates cross-sectional planes of three-dimensional data. For example, the image 42 is an image taken on an X-Y cross-sectional plane. The image 43 is an image taken on a Z-Y cross-sectional plane. The image 44 is an image taken on an cross-sectional plane.

Figure 15:
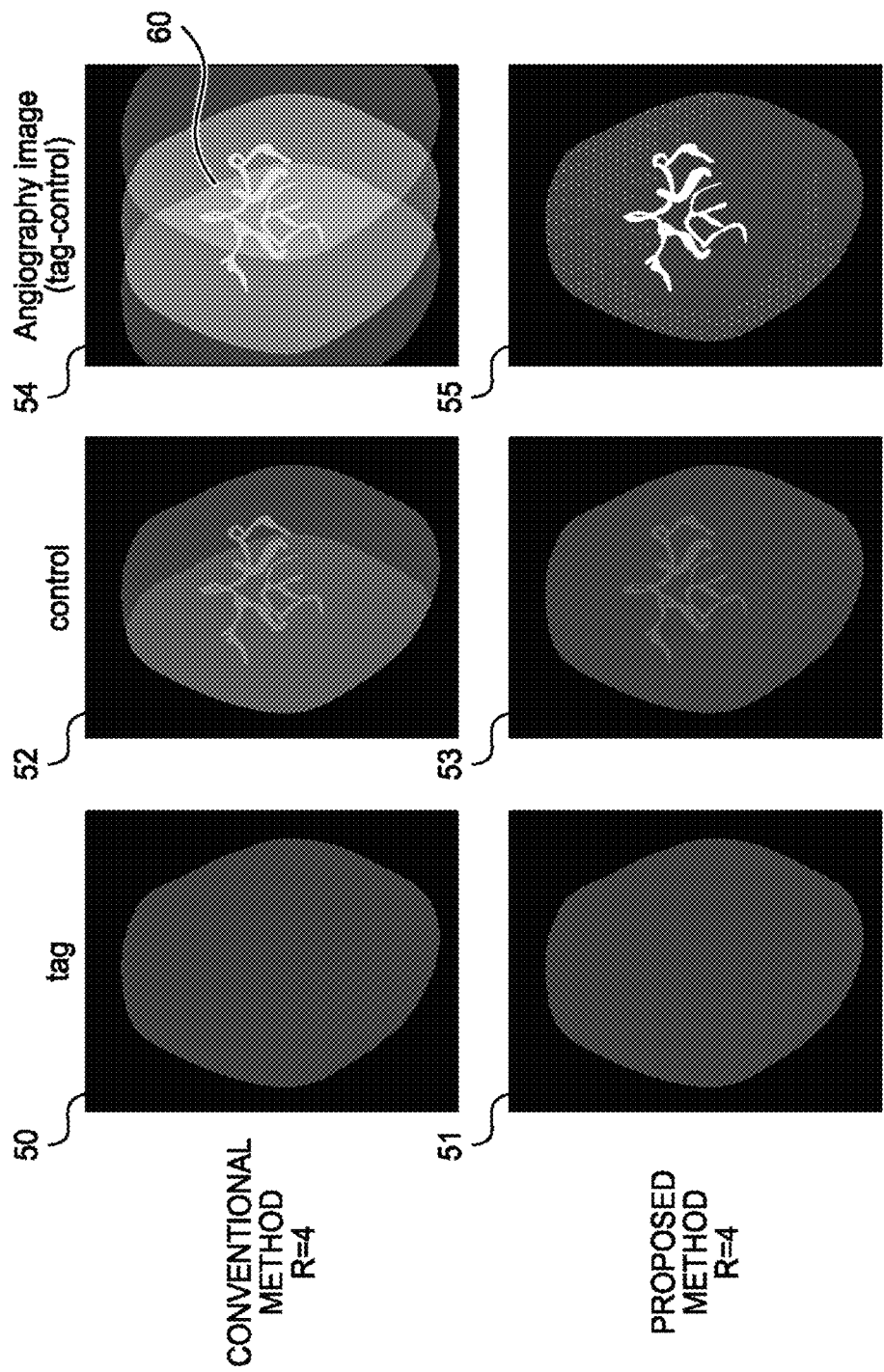
FIG. 15 is a drawing comparing the image generating process performed by the magnetic resonance imaging apparatus according to the first embodiment with a conventional image generating process.

FIG. 15 is a drawing comparing an image generating process performed by the magnetic resonance imaging apparatus according to the first embodiment with a process implementing a conventional method. The conventional method that does not use the local weighting coefficient W and a method according to the embodiment that uses the local weighting coefficient W are compared with each other, while both satisfy the reduction factor R=4. An image 50 is a tag image according to the conventional method. An image 51 is a tag image according to the method of the embodiment. An image 52 is a control image according to the conventional method. An image 3 is a control image according to the method of the embodiment. It is possible to obtain the blood vessel image (an angiography image (a tag-control image)) on the right-hand side of FIG. 15, by subtracting the control image in the middle section of FIG. 15 from the tag image on the left-hand side of FIG. 15. An image 54 is a blood vessel image according to the conventional method. An image 55 is a blood vessel image obtained according to the method of the embodiment. As the image 54 according to the conventional method is compared with the image 55 according to the method of the embodiment, the quality of the image 54 according to the conventional method is degraded due to aliasing (in a region 60, for example). The image 55 according to the method of the embodiment is able to achieve high quality because artifacts in the background are suppressed by the regularization process performed by using the local weighting coefficient W.

The regularization term in the third term of Expression (4) is an $L_2$ norm that has applied thereto the local weighting coefficient W with respect to the difference image $x_T$-$x_O$ between the first image and the second image. Accordingly, when the first k-space data and the second k-space data (the control-image-purpose k-space data) are equal to each other, the regularization term is equal to C. In this manner, by employing the image generating function 122e, the processing circuitry 150 is able to effectively render the blood vessel image by performing the regularization process with the use of the regularization term obtained by multiplying the difference image $x_T$-$x_O$ (i.e., the data rendering the blood vessels by calculating the difference between the data acquired by applying the labeling pulse and the data acquired by applying no labeling pulse) by the local weighting coefficient W.

Further, in the first embodiment, the regularization process is performed with respect to each of the times of the time-series data. In other words, by employing the image generating function 122e, the processing circuitry 150 generates the output target image by performing the image reconstructing process with respect to each of the times of the time-series k-space data.

To summarize the above configuration, in the first embodiment, by employing the image generating function 122e, the processing circuitry 150 generates the output target image by performing the image reconstructing process on the k-space data while performing the regularization process with the use of the local weighting coefficient W. In an example, by employing the image generating function 122e, the processing circuitry 150 generates the output target image by generating the folded image by applying the Fourier transform to the k-space data and further unfolding the folded image by performing the process involving the regularization term (the term including the local weighting coefficient W). In that situation, the processing circuitry 150 applies the weight to the regularization term, on the basis of whether or not each of the pixels in the output target image is included in the observation target region. For example, the processing circuitry 150 uses the local weighting coefficient W arranged in such a manner that the weight is smaller when being applied to a pixel position estimated by the estimating function 122b to be included in the observation target region than when being applied to a pixel position estimated not to be included in the observation target region.

In the first embodiment, the example is explained in which the processing circuitry 150 including the image generating function 122e performs the regularization process by using the $L_2$ norm as the regularization term; however, possible embodiments are not limited to this example. For instance, the processing circuitry 150 including the image generating function 122e may perform the regularization process by using another norm (e.g., an $L_1$ norm) as a regularization term. Further, the processing circuitry 150 including the image generating function 122e may perform the regularization process by further adding one or more other regularization processes thereto. For instance, the processing circuitry 150 including the image generating function 122e may perform the regularization process by adding a Total Variation (TV) regularization term thereto.

In the first embodiment, the example is explained in which the sequence controlling circuitry 110 executes the first pulse sequence to apply the labeling pulse to the labeled region within the image taking region and the second pulse sequence to apply the labeling pulse; however, possible embodiments are not limited to this example. For instance, the sequence controlling circuitry 110 may execute a first pulse sequence to be executed after a contrast agent is administered to the subject and a second pulse sequence to be executed while no contrast agent is administered to the subject.

In the first embodiment, the example is explained in which the processing circuitry 150 including the obtaining function 122d obtains the time-series k-space data; however, possible embodiments are not limited to this example. For instance, the processing circuitry 150 including the obtaining function 122d may be configured to obtain k-space data in a single time phase, instead of the time-series k-space data.

In the first embodiment, the example is explained in which the sequence controlling circuitry 110 executes the first pulse sequence for generating the tag image and the second pulse sequence for generating the control image, whereas the processing circuitry 150 including the obtaining function 122d obtains the two pieces of k-space data for the tag-image generating-purpose and for the control-image generating-purpose, so that the processing circuitry 150 reconstructs the tag image and the control image by employing the image generating function 122e; however, possible embodiments are not limited to this example. For instance, the sequence controlling circuitry 110 may execute a single pulse sequence, so that the processing circuitry 150 including the obtaining function 122d obtains one piece of k-space data and so that the processing circuitry 150 generates an image to be output from the k-space data by employing the image generating function 122e. In that situation, by employing the image generating function 122e, the processing circuitry 150 generates the image to be output by performing an optimization process while performing the regularization process on the basis of Expression (3), for example.

According to the first embodiment, it is possible to improve the robustness of the solution and to suppress the artifacts in the background region by estimating the blood vessel region pixels from the pre-reconstruction tag/control k-space data and introducing the estimation into the regularization term.

A First Modification Example of the First Embodiment

In the first embodiment, the example is explained in which the local weighting coefficient W for the observation target region calculated by the processing circuitry 150 including the estimating function 122b is smaller than the local weighting coefficient W for the region that is not the observation target region; however, possible embodiments are not limited to this example. For instance, the processing circuitry 150 including the estimating function 122b may perform the calculation in such a manner that a local weighting coefficient W for the observation target region is larger than a local weighting coefficient for the region that is not the observation target region. In that situation, for example, the processing circuitry 150 including the estimating function 122b calculates the local weighting coefficient W in such a manner that the weighting coefficient W for the observation target region is equal to 1, whereas the weighting coefficient W for the regions that are not the observation target is equal to 0. In conjunction with this procedure, the processing circuitry 150 including the image generating function 122e performs an image generating process by using a regularization term as presented in Expression below, for example.

$$E(x) = \sum_{c=1} \|y_{Tc} - A_{Tc}x_T\|_2 + \sum_{c=1} \|y_{Oc} - A_{Oc}x_O\|_2 + \lambda\|(1 - W) \cdot (x_T - x_O)\|_2 \quad (5)$$

Further, in the embodiment above, the example is explained in which the processing circuitry 150 including the image generating function 122e performs the image generating process by using the regularization term in the form of the product of the local weighting coefficient W and the output target image x; however, possible embodiments are not limited to this example. For instance, the processing circuitry 150 including the image generating function 122e may perform the image generating process by using a regularization term in any other form. For example, the processing circuitry 150 including the image generating function 122e may use a regularization term obtained by calculating a norm of the regularization term in Expression (4) or (5) and further applying a continuous function thereto. Alternatively, in the reverse order, the processing circuitry 150 may use a regularization term obtained by applying a continuous function first and subsequently calculating a norm. In another example, the processing circuitry 150 including the image generating function 122e may perform an expanding process by using a predetermined basis function such as an orthogonal function and subsequently calculating a norm.

Second Embodiment

In the first embodiment, the example is explained in which the processing circuitry 150 including the image generating function 122e generates the output target image by performing the optimization process and the reconstructing process on the tag image and the control image simultaneously by using Expression (4) and further performing the difference calculating process between the reconstructed tag image and the reconstructed control image; however, possible embodiments are not limited to this example. For instance, the processing circuitry 150 may at first perform a difference calculating process between the tag-image-purpose k-space data and the control-image-purpose k-space data and may further perform an image reconstructing process on the data resulting from the difference calculating process.

Figure 16:
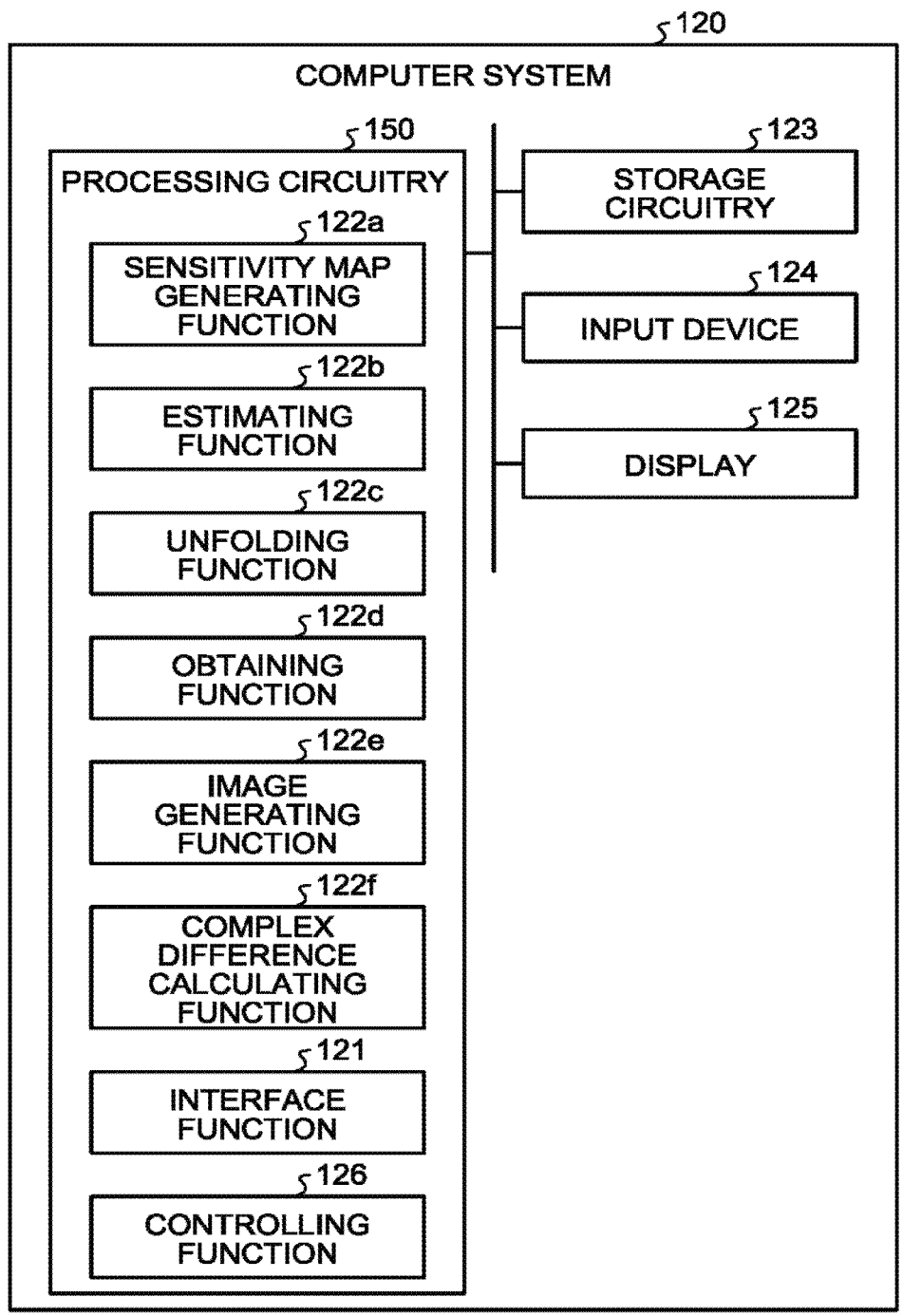
FIG. 16 is a block diagram illustrating a magnetic resonance imaging apparatus according to a second embodiment.

FIG. 16 is a block diagram illustrating the computer system 120 included in the magnetic resonance imaging apparatus 100 according to the second embodiment. In addition to the configuration described in the first embodiment, the processing circuitry 150 further includes a complex difference calculating function 122f. The functions other than the complex difference calculating function 122f and the constituent elements other than the processing circuitry 150 are the same as those in the magnetic resonance imaging apparatus according to the first embodiment.

In the second embodiment, the processing circuitry 150 including the image generating function 122e performs an image reconstructing process on a difference image between the tag image and the control image. More specifically, by employing the complex difference calculating function 112f, the processing circuitry 150 calculates the complex difference between the two types of 4D k-space data corresponding to the tag and the control so as to prepare the calculated complex difference data for the unfolding function 222c, any time before the process at step 3203 in FIG. 5 is started. This process is the same as the process performed at step S202a by the processing circuitry 150 by employing the region estimating function 122b. Thus, the processing circuitry 150 may substitute the process performed by the complex difference calculating function 222d with the process at step S202a.

The processing circuitry 150 including the unfolding function 122c and the image generating function 122e generates a single piece of difference x-space data free of aliasing, by using the difference 4D k-space data generated by a complex difference calculating function 222d, the sensitivity maps obtained by the sensitivity map generating function 122a, and the weighting coefficient obtained by the estimating function 122b. More specifically, the processing circuitry 150 including the image generating function 122e reconstructs the image by minimizing the energy function in Expression (6).

$$E(x) = \sum_{c=1} \|y_{Ac} - A_{Ac}x_A\|_2 + \lambda\|Wx_A\|_2 \quad (6)$$

In Expression (6), the subscript A denotes a blood vessel image that is a difference image between the tag image and the control image. When the magnetic resonance imaging apparatus according to the second embodiment is used, because only the difference image is reconstructed, it is possible to reduce the memory capacity and the calculation time period required in the reconstructing process.

An Image Processing Apparatus

In the embodiments described above, the example is explained in which the magnetic resonance imaging apparatus 100, which is a medical image diagnosis apparatus, performs the various types of processes; however, possible embodiments are not limited to this example. For instance, in place of the magnetic resonance imaging apparatus 100, either an image processing apparatus or an image processing system including the magnetic resonance imaging apparatus 100 and an image processing apparatus may perform the various types of processes described above. In this situation, the image processing apparatus may be, for example, a workstation, an image storing apparatus (an image server) or a viewer in a Picture Archiving and Communication System (PACS), any of various types of apparatuses in an electronic medical record system, or the like. In that situation, for example, the image processing apparatus receives the k-pace data acquired by the magnetic resonance imaging apparatus 100 from the magnetic resonance imaging apparatus 100 or from the image server via a network or by receiving an input from the operator via a recording medium, and further stores the received k-space data into the storage circuitry 123. After that, the image processing apparatus performs the various types of processes described above on the k-space data stored in the storage circuitry 123.

A Computer Program

The instructions in tree processing procedure explained in the embodiments described above may be executed on the basis of a computer program (hereinafter, simply "program") that is realized as software. A commonly-used computer system may be able to achieve advantageous effects that are the same as those achieved by the magnetic resonance imaging apparatus or the image processing apparatus according to the embodiments described above, by storing therein the program in advance and reading the program. The instructions explained in the embodiments described above may be recorded as a computer-executable program on a recording medium such as a magnetic disk (a flexible disk, a hard disk, etc.), an optical disk (a Compact Disk Read-Only Memory [CD-ROM], a Compact Disk Recordable [CD-R], a Compact Disk Rewritable [CD-RW], a Digital Versatile Disk Read-Only Memory [DVD-ROM], a Digital Versatile Disk Recordable [DVD±R], Digital Versatile Disk Rewritable [DVD±RW], etc.), a semiconductor memory, or the like. As long as the storage medium is readable by a computer or an incorporated system, any storage format may be used. The computer is able to realize the same operations as those performed by the magnetic resonance imaging apparatus or the image processing apparatus according to the embodiments described above, by reading the program from the recording medium and further causing a CPU to execute the instructions described in the program on the basis of the program. Needless to say, when obtaining or reading the program, the computer may obtain or read the program via a network.

Further, a part of the processes for realizing the embodiments described above may be executed by an Operating System (OS) working in a computer, middleware (MW) such as database management software, a network, or the like, on the basis of the instructions in the program installed into the computer or the incorporated system from the storage medium.

Further, the storage medium does not necessarily have to be a medium independent of the computer or the incorporated system. The storage medium may be one that has downloaded and stored therein or temporarily stored therein the program transferred via a Local Area Network (LAN), the Internet, or the like.

Further, the quantity of storage media in use does not necessarily have to be one. Possible modes of the storage medium according to the embodiments include a mode in which the processes described in the embodiments above are executed from a plurality of media. The medium may be configured in any arbitrary manner.

The computer and the incorporated system according to the embodiments are each configured so as to execute the processes described in the embodiments above on the basis of the program stored in the one or more storage media. Accordingly, the computer and the incorporated system may each be configured as a single apparatus such as a personal computer or a microcomputer or may each be configured as a system in which a plurality of apparatuses are connected together via a network.

The computer according to the embodiments does not necessarily have to be a personal computer and may be an arithmetic processing apparatus included in an information processing device, a microcomputer, or the like. The term "computer" generally refers to various types of devices and apparatuses that are capable of realizing the functions described in the embodiments on the basis of the program.

According to at least one aspect of the embodiments described above, it is possible to enhance the quality of the output target image obtained in the parallel imaging process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
sequence controlling circuitry configured to acquire k-space data by executing a pulse sequence while performing undersampling; and
processing circuitry configured to generate an output target image by generating a folded image by applying a Fourier transform to the k-space data and further unfolding the folded image by performing a process that uses a regularization term,
wherein the processing circuitry is configured to apply a weight to the regularization term on a basis of whether or not each of pixels in the output target image is included in an observation target region, wherein the processing circuitry is configured to generate the output target image by using the regularization term to which the weight is applied in such a manner that the weight is smaller when being applied to a pixel position estimated to be included in the observation target region than when being applied to a pixel position estimated not to be included in the observation target region.

2. The magnetic resonance imaging apparatus according to claim 1, wherein with respect to each of the pixels, the weight applied to the regularization term is equal to 0 when a pixel position of the pixel is included in the observation target region and is equal to 1 when a pixel position of the pixel is not included in the observation target region.

3. The magnetic resonance imaging apparatus according to claim 1, wherein the weight applied to the regularization term is a value calculated on a basis of an estimated value for a probability that a pixel position of each of the pixels is included in the observation target region.

4. The magnetic resonance imaging apparatus according to claim 1, wherein the weight applied to the regularization term is a value calculated by putting together values each of which is calculated for a different one of channels that are units of acquisition of the k-space data.

5. The magnetic resonance imaging apparatus according to claim 1, wherein the processing circuitry is configured to generate the output target image by minimizing a sum of an objective function and the regularization term.

6. A magnetic resonance imaging apparatus comprising:
sequence controlling circuitry configured to acquire k-space data by executing a pulse sequence while performing undersampling; and
processing circuitry configured to generate an output target image by generating a folded image by applying a Fourier transform to the k-space data and further unfolding the folded image by performing a process that uses a regularization term,
wherein the processing circuitry is configured to apply a weight to the regularization term on a basis of whether or not each of pixels in the output target image is included in an observation target region, and
wherein the processing circuitry is configured to generate the output target image by adding, to an objective function, a norm of a vector obtained by multiplying, for each of the pixels, a value of each of the pixels in the output target image by the weight applied to the regularization term, as the regularization term, and further calculating the output target image so as to minimize a sum of the objective function and the regularization term.

7. A magnetic resonance imaging apparatus comprising:
sequence controlling circuitry configured to acquire k-space data by executing a pulse sequence while performing undersampling; and
processing circuitry configured to generate an output target image by generating a folded image by applying a Fourier transform to the k-space data and further unfolding the folded image by performing a process that uses a regularization term,
wherein the processing circuitry is configured to apply a weight to the regularization term on a basis of whether or not each of pixels in the output target image is included in an observation target region
wherein the sequence controlling circuitry is configured to execute a first pulse sequence and a second pulse sequence while performing the undersampling with at least one selected from between the first pulse sequence and the second pulse sequence, so as to acquire first k-space data by using the first pulse sequence and to acquire second k-space data by using the second pulse sequence, and
wherein the processing circuitry is
configured to estimate whether or not a pixel position of each of the pixels in the output target image is included in the observation target region on a basis of data generated by using the first k-space data and the second k-space data,
configured to apply the weight to the regularization term on a basis of a result of the estimation,
configured to generate a first image by performing an image reconstructing process on the first k-space data,
configured to generate a second image by performing an image reconstructing process on the second k-space data, and
configured to generate the output target image on a basis of the first image and the second image.

8. The magnetic resonance imaging apparatus according to claim 7, wherein the regularization term is configured to be equal to 0 when the first k-space data and the second k-space data are equal to each other.

9. The magnetic resonance imaging apparatus according to claim 7, wherein
the first pulse sequence is a pulse sequence to apply a labeling pulse to a labeled region within an image taking region, and
the second pulse sequence is a pulse sequence to apply no labeling pulse.

10. The magnetic resonance imaging apparatus according to claim 7, wherein
the first pulse sequence is a pulse sequence executed after a contrast agent is administered to a subject, and
the second pulse sequence is a pulse sequence executed while no contrast agent is administered to the subject.

11. A magnetic resonance imaging apparatus comprising:
sequence controlling circuitry configured to acquire k-space data by executing a pulse sequence while performing undersampling; and
processing circuitry configured to generate an output target image by generating a folded image by applying a Fourier transform to the k-space data and further unfolding the folded image by performing a process that uses a regularization term,
wherein the processing circuitry is configured to apply a weight to the regularization term on a basis of whether or not each of pixels in the output target image is included in an observation target region,
wherein the sequence controlling circuitry is configured to acquire time-series k-space data as the k-space data, and
wherein the processing circuitry is
configured to estimate whether or not a pixel position of each of the pixels in the output target image is included in the observation target region on a basis of k-space data that has been generated by using the time-series k-space data and has no time axis and
configured to apply the weight on a basis of a result of the estimation.

12. A magnetic resonance imaging apparatus comprising:
sequence controlling circuitry configured to acquire k-space data by executing a pulse sequence while performing undersampling; and
processing circuitry configured to generate an output target image by generating a folded image by applying a Fourier transform to the k-space data and further unfolding the folded image by performing a process that uses a regularization term,
wherein the processing circuitry is configured to apply a weight to the regularization term on a basis of whether or not each of pixels in the output target image is included in an observation target region,
wherein the sequence controlling circuitry is configured to acquire time-series k-space data as the k-space data, and
wherein the processing circuitry is configured to generate the output target image by performing a regularization process with respect to each of times of the time-series k-spaced data and performing an image reconstructing process on the time-series k-space data with respect to each of the times.

13. An imaging processing apparatus comprising:
processing circuitry configured to generate an output target image, by generating a folded image by applying a Fourier transform to k-space data acquired with use of a pulse sequence executed while performing undersampling and further unfolding the folded image by performing a process that uses a regularization term, wherein the processing circuitry is configured to apply a weight to the regularization term on a basis of whether or not each of pixels in the output target image is included in an observation target region, and wherein the processing circuitry is configured to generate the output target image by using the regularization term to which the weight is applied in such a manner that the weight is smaller when being applied to a pixel position estimated to be included in the observation target region than when being applied to a pixel position estimated not to be included in the observation target region.

14. An imaging processing apparatus comprising:
processing circuitry configured to generate an output target image, by generating a folded image by applying a Fourier transform to k-space data acquired with use of a pulse sequence executed while performing undersampling and further unfolding the folded image by performing a process that uses a regularization term,
wherein
the processing circuitry is configured to apply a weight to the regularization term on a basis of whether or not each of pixels in the output target image is included in an observation target region, and
the processing circuitry is configured to generate the output target image by adding, to an objective function, a norm of a vector obtained by multiplying, for each of the pixels, a value of each of the pixels in the output target image by the weight applied to the regularization term, as the regularization term, and further calculating the output target image so as to minimize a sum of the objective function and the regularization term.

15. An imaging processing apparatus comprising:
a processing circuitry configured to generate an output target image, by generating a folded image by applying a Fourier transform to k-space data acquired with use of a pulse sequence executed while performing undersampling and further unfolding the folded image by performing a process that uses a regularization term,
wherein the processing circuitry is configured to apply a weight to the regularization term on a basis of whether or not each of pixels in the output target image is included in an observation target region,
wherein the k-space data comprises time-series k-space data, and
wherein the processing circuitry is configured to:
estimate whether or not a pixel position of each of the pixels in the output target image is included in the observation target region on a basis of k-space data that has been generated by using the time-series k-space data and has no time axis, and
apply the weight on a basis of a result of the estimation.

16. A magnetic resonance imaging method implemented during a magnetic resonance imaging process, comprising:
acquiring k-space data by executing a pulse sequence while performing undersampling; and
generating an output target image, by generating a folded image by applying a Fourier transform to the k-space data and further unfolding the folded image by performing a process that uses a regularization term to which a weight is applied on a basis of whether or not each of pixels in the output target image is included in an observation target region,
wherein when applying the regularization term to the weight, the regularization terms is applied to (a) a smaller weight when being applied to a pixel position estimated to be included in the observation target region and (b) a larger weight when being applied to a pixel position estimated not to be included in the observation target region.

17. A magnetic resonance imaging method implemented during a magnetic resonance imaging process, comprising:
acquiring k-space data by executing a pulse sequence while performing undersampling; and
generating an output target image, by generating a folded image by applying a Fourier transform to the k-space data and further unfolding the folded image by performing a process that uses a regularization term to which a weight is applied on a basis of whether or not each of pixels in the output target image is included in an observation target region,
wherein the generating the output target image comprises:
adding, to an objective function, a norm of a vector obtained by multiplying, for each of the pixels, a value of each of the pixels in the output target image by the weight applied to the regularization term, as the regularization term, and
calculating the output target image so as to minimize a sum of the objective function and the regularization term.

18. A magnetic resonance imaging method implemented during a magnetic resonance imaging process, comprising:
acquiring k-space data by executing a pulse sequence while performing undersampling; and
generating an output target image, by generating a folded image by applying a Fourier transform to the k-space data and further unfolding the folded image by performing a process that uses a regularization term to which a weight is applied on a basis of whether or not each of pixels in the output target image is included in an observation target region,
wherein the k-space data comprises time-series k-space data, and
wherein the generating comprises:
estimating whether or not a pixel position of each of the pixels in the output target image is included in the observation target region on a basis of k-space data that has been generated by using the time-series k-space data and has no time axis, and
applying the weight on a basis of a result of the estimation.

* * * * *